US006842314B2

United States Patent
Sasaki et al.

(10) Patent No.: US 6,842,314 B2
(45) Date of Patent: Jan. 11, 2005

(54) MAGNETORESISTIVE DEVICE AND METHOD OF MANUFACTURING SAME, AND THIN-FILM MAGNETIC HEAD AND METHOD OF MANUFACTURING SAME

(75) Inventors: Yoshitaka Sasaki, Milpitas, CA (US); Takehiro Kamigama, Hong Kong (CN)

(73) Assignees: Headway Technologies, Incorporated, Milpitas, CA (US); SAE Magnetics (H.K.) Limited, Hong Kong (CN)

( * ) Notice: Subject to any disclaimer, the term of this patent is extended or adjusted under 35 U.S.C. 154(b) by 102 days.

(21) Appl. No.: 10/155,973

(22) Filed: May 29, 2002

(65) Prior Publication Data
US 2003/0223158 A1 Dec. 4, 2003

(51) Int. Cl.$^7$ .............................................. G11B 5/127
(52) U.S. Cl. ...................................................... 360/322
(58) Field of Search ........................................ 360/322

(56) References Cited

U.S. PATENT DOCUMENTS

| | | | |
|---|---|---|---|
| 6,493,194 B1 * | 12/2002 | Sakaguchi et al. | 360/322 |
| 2002/0093773 A1 * | 7/2002 | Pinarbasi | 360/322 |
| 2002/0191353 A1 * | 12/2002 | Sato | 360/322 |
| 2003/0011943 A1 * | 1/2003 | Webb et al. | 360/324.1 |
| 2003/0189798 A1 * | 10/2003 | Lin et al. | 360/322 |

FOREIGN PATENT DOCUMENTS

| JP | A 11-224411 | 8/1999 |
|---|---|---|
| JP | A 2000-76629 | 3/2000 |

OTHER PUBLICATIONS

U.S. patent application Ser. No. 10/146,924, Sasaki et al., filed May 17, 2002.

* cited by examiner

*Primary Examiner*—David Ometz
*Assistant Examiner*—Mark Blouin
(74) *Attorney, Agent, or Firm*—Oliff & Berridge, PLC

(57) ABSTRACT

A reproducing head of a thin-film magnetic head incorporates an MR element, a pair of bias field applying layers located to be adjacent to side portions of the MR element, and a pair of electrode layers that are located on the bias field applying layers and overlap the MR element. The electrode layers each have a first layer, a second layer, and a third layer. The first layer is laid over part of the top surface of the MR element via a protection layer, the second layer overlaps the first layer, and the third layer is located on the second layer. The second layer is thinner than the third layer. In the method of manufacturing the reproducing head, after the protection layer is formed on an element-to-be film to make the MR element, a first electrode-to-be film to make the first layers is formed continuously without interposing a step of exposing the protection layer to the air.

26 Claims, 22 Drawing Sheets

MAGNETORESISTIVE DEVICE AND METHOD OF MANUFACTURING SAME, AND THIN-FILM MAGNETIC HEAD AND METHOD OF MANUFACTURING SAME

BACKGROUND OF THE INVENTION

1. Field of the Invention

The present invention relates to a magnetoresistive device that incorporates a magnetoresistive element and a method of manufacturing same, and to a thin-film magnetic head that incorporates a magnetoresistive element and a method of manufacturing same.

2. Description of the Related Art

With recent enhancements in the areal recording density of hard disk drives, improved performance has been sought of thin-film magnetic heads. For the past few years in particular, hard disk drives have been doubling in areal recording density roughly each year, requiring areal recording densities of 100 Gbit/(inch)$^2$ or more lately.

Among the thin-film magnetic heads, widely used are composite thin-film magnetic heads made of a layered structure including a recording head having an induction-type electromagnetic transducer for writing and a reproducing head having a magnetoresistive element (that may be hereinafter called an MR element) for reading.

MR elements include: an AMR element that utilizes the anisotropic magnetoresistive effect; a GMR element that utilizes the giant magnetoresistive effect; and a TMR element that utilizes the tunnel magnetoresistive effect.

Reproducing heads that exhibit a high sensitivity and a high output are required. Reproducing heads that meet these requirements are GMR heads incorporating spin-valve GMR elements. Such GMR heads have been mass-produced.

In general, a spin-valve GMR element incorporates: a nonmagnetic conductive layer having two surfaces that face toward opposite directions; a free layer that is located adjacent to one of the surfaces of the nonmagnetic conductive layer and has a direction of magnetization that varies in response to a signal magnetic field from a recording medium; a pinned layer that is located adjacent to the other of the surfaces of the nonmagnetic conductive layer and has a fixed direction of magnetization; and an antiferromagnetic layer that is located adjacent to one of surfaces of the pinned layer that is farther from the nonmagnetic conductive layer and fixes the direction of magnetization of the pinned layer. The free layer and the pinned layer are each made of a ferromagnetic layer. An electric resistance value of the free layer varies according to the direction of magnetization of the free layer. The spin-valve GMR element utilizes the variations in the electric resistance value of the free layer to reproduce data that is magnetically recorded on the recording medium.

Another characteristic required for reproducing heads is a small Barkhausen noise. Barkhausen noise results from transition of a domain wall of a magnetic domain of an MR element. If Barkhausen noise occurs, an abrupt variation in output results, which induces a reduction in signal-to-noise ratio (S/N ratio) and an increase in error rate.

To reduce Barkhausen noise, a bias magnetic field in the longitudinal direction (that may be hereinafter called a longitudinal bias field) is applied to the MR element. To apply the longitudinal bias field to the MR element, bias field applying layers may be provided on both sides of the MR element, for example. Each of the bias field applying layers is made of a laminate of a ferromagnetic layer and an antiferromagnetic layer, or a permanent magnet, for example.

In a reproducing head in which bias field applying layers are provided on both sides of the MR element, in general, a pair of electrode layers for feeding a current used for signal detection (hereinafter called a sense current) to the MR element are located to touch the bias field applying layers.

In general, the MR element is sandwiched between a bottom shield layer and a top shield layer. A bottom shield gap film that is an insulating film is interposed between the MR element and the bottom shield layer. Similarly, a top shield gap film that is an insulating film is interposed between the MR element and the top shield layer. A base layer may be provided between the MR element and the bottom shield gap film for the purpose of attaining better orientation and magnetic properties of magnetic layers that constitute the MR element. For example, a Ta or Cr compound may be used as a material of the base layer. Between the MR element and the top shield gap film, a protection layer may be formed after forming films making up the MR element, for the purpose of protecting those films. The protection layer may be made of Ta, for example.

Reference is now made to FIG. 21 through FIG. 24 to describe an example of a method of manufacturing a reproducing head. In this manufacturing method, as shown in FIG. 21, a bottom shield gap film 104 made of alumina ($Al_2O_3$), for example, is first formed on a bottom shield layer 103 made of NiFe, for example. A base layer 105 is formed on the bottom shield gap film 104. Then, an MR-element-to-be film 106P to make the MR element is formed on the base layer 105. A protection layer 107 is then formed on the MR-element-to-be film 106P. Then, a mask 108 for patterning the MR-element-to-be film 106P by etching is formed on the protection layer 107. The mask 108 is made of a photoresist layer patterned by photolithography. For easy lift-off, the mask 108 is formed to have a T-shaped cross section, i.e., such a shape that a portion close to the bottom is smaller in width than a portion close to the top.

Next, as shown in FIG. 22, ion beam etching is performed so that ion beams travel at an angle of 5 to 10° with respect to the direction perpendicular to the top surface of the bottom shield layer 103, thereby partially etching the protection layer 107, the MR-element-to-be film 106P, and the base layer 105. The protection layer 107, the MR-element-to-be film 106P, and the base layer 105 are thus patterned. The MR-element-to-be film 106P makes an MR element 106 as a result of the patterning.

Next, as shown in FIG. 23, a hard magnetic layer 109P for making bias field applying layers is formed by sputtering on the entire top surface of the laminate obtained by the steps so far, with the mask 108 left unremoved. The hard magnetic layer 109P is made of CoPt, for example. The mask 108 is then lifted off. Portions of the hard magnetic layer 109P remaining after the liftoff make a pair of bias field applying layers 109.

Next, as shown in FIG. 24, a pair of electrode layers 110 are formed on the pair of bias field applying layers 109. The electrode layers 110 are made of a laminate of Au and Ta films, for example. A top shield gap film 111 made of alumina, for example, is then formed on the entire top surface of the laminate. Then, although not shown, a top shield layer is formed on the entire top surface of the laminate.

As disclosed in, e.g., Published Unexamined Japanese Patent Applications (KOKAI) Heisei 11-224411 and 2000-

76629, it is known that, when the bias field applying layers are located on both sides of the MR element, regions that may be hereinafter called lower-sensitivity regions develop near ends of the MR element that are adjacent to the bias field applying layers. In these regions, the magnetic field produced from the bias field applying layers limits variations of the direction of magnetization, and the sensitivity is thereby lowered. Consequently, if the electrode layers are located so as not to overlap the MR element, a sense current passes through the lower-sensitivity regions, which thereby reduces the output of the reproducing head. This problem becomes more noticeable as the track width of the reproducing head becomes smaller.

To solve this problem, each of the electrode layers is located such that a portion thereof is laid over part of (hereinafter expressed as "overlap") the MR element, as disclosed in, e.g., Published Unexamined Japanese Patent Applications (KOKAI) Heisei 11-224411 and 2000-76629. It is possible to reduce Barkhausen noise while preventing a reduction in output of the reproducing head, if the reproducing head has a structure (hereinafter called an overlapping electrode layer structure) in which the bias field applying layers are located on both sides of the MR element, and the electrode layers overlap the MR element, as described above.

Reference is now made to FIG. 25 through FIG. 27 to describe an example of a method of manufacturing a reproducing head having the overlapping electrode layer structure. This manufacturing method has the same steps as those described with reference to FIG. 21 through FIG. 23 up to the step of forming the bias field applying layers 109.

In this manufacturing method, after the mask 108 is lifted off, as shown in FIG. 25, a mask 112 for forming the electrode layers by a lift-off method is formed on the protection layer 107. The mask 112 is made of a photoresist layer patterned by photolithography. The mask 112 has a width smaller than that of the mask 108 shown in FIG. 21 through FIG. 23. For easy lift-off, the mask 112 is formed to have a T-shaped cross section.

Next, as shown in FIG. 26, an electrode-to-be film 113P to make the electrode layers is formed by sputtering on the entire top surface of the laminate. The electrode-to-be film 113P is made of a laminate of Au and Ta films, for example.

Next, as shown in FIG. 27, the mask 112 is lifted off. Portions of the electrode-to-be film 113P remaining after the liftoff make a pair of electrode layers 113. The electrode layers 113 are located to overlap the MR element 106. Then, although not shown, a top shield gap film and a top shield layer are formed in this order on the entire top surface of the laminate. In the reproducing head thus fabricated, the space between the pair of electrode layers 113 defines the optical track width of the reproducing head.

The method of manufacturing the reproducing head shown in FIG. 25 through FIG. 27 requires two masks, namely, the mask 108 for defining the width of the MR element 106 and the space between the pair of bias field applying layers 109, and the mask 112 for defining the space between the pair of electrode layers 113. In typical reproducing heads of the overlapping electrode layer structure, the electrode layers 113 are formed to overlap the MR element 106 by a width of, e.g., 0.1 to 0.2 $\mu$m each from the end of each of the bias field applying layers 109 toward the center of the MR element 106 along the width thereof. The two electrode layers 113 are controlled to have the same overlap amount. Hence, alignment of the masks 108 and 112 is of extreme importance.

According to the method of manufacturing the reproducing head shown in FIG. 25 through FIG. 27, however, the MR element 106 and the bias field applying layers 109 are patterned by using the mask 108 while the electrode layers 113 are patterned by using the mask 112. Hence, it is extremely difficult for this manufacturing method to locate the two electrode layers 113 in position as designed. As a result, this manufacturing method presents problems that the actual track width may deviate from a designed value, and that the overlap amount of at least one of the electrode layers 113 may fall below a designed value and the effect of the overlapping electrode layer structure against a drop in output of reproducing heads is thereby hampered.

To solve the foregoing problems, a method of manufacturing a reproducing head as described below is employable. In this manufacturing method, a single mask is used to pattern the MR element, the bias field applying layers and the electrode layers in a self-aligned manner. This manufacturing method will be described with reference to FIG. 28 through FIG. 30. This manufacturing method has the same steps as those described with reference to FIG. 21 up to the step of forming the protection layer 107.

Then, in this manufacturing method, as shown in FIG. 28, a mask 114 for patterning the MR element, the bias field applying layers and the electrode layers is formed on the protection layer 107. The mask 114 is made of a photoresist layer patterned by photolithography. For easy lift-off, the mask 114 is formed to have a T-shaped cross section. Hereinafter, a portion of the mask 114 that is closer to the bottom and smaller in width will be referred to as a root portion.

Then, ion beam etching is performed so that ion beams travel at an angle of 5 to 10° with respect to the direction perpendicular to the top surface of the bottom shield layer 103, thereby partially etching the protection layer 107, the MR-element-to-be film 106P, and the base layer 105. The protection layer 107, the MR-element-to-be film 106P, and the base layer 105 are thus patterned. The MR-element-to-be film 106P makes the MR element 106 as a result of the patterning.

Next, ion beam deposition is performed so that ion beams travel at an angle of 0 to 5° with respect to the direction perpendicular to the top surface of the bottom shield layer 103. The hard magnetic layer 109P to make the bias field applying layers is thereby formed on the entire top surface of the laminate. The hard magnetic layer 109P is made of CoPt, for example. In FIG. 28, the arrows represent ion beams.

Then, as shown in FIG. 29, ion beam deposition is performed so that ion beams travel at an angle of 45° with respect to the direction perpendicular to the top surface of the bottom shield layer 103, with the mask 114 left unremoved. The electrode-to-be film 113P to make the electrode layers is thereby formed on the entire top surface of the laminate. The electrode-to-be film 113P is made of Au, for example. On the protection layer 107, the electrode-to-be film 113P is formed to extend to the vicinity of the root portion of the mask 114. In FIG. 29, the arrows represent ion beams.

Next, as shown in FIG. 30, the mask 114 is lifted off. As a result, the remaining portions of the hard magnetic layer 109P make a pair of bias field applying layers 109, and the remaining portions of the electrode-to-be film 113P make a pair of electrode layers 113. Next, a top shield gap film 115 made of alumina, for example, is formed on the entire top surface of the laminate. Next, although not shown, a top shield layer is formed on the entire top surface of the laminate.

The manufacturing method shown in FIG. 28 through FIG. 30 can solve the problems of the manufacturing method shown in FIG. 25 through FIG. 27. The method of FIG. 28 through FIG. 30, however, has the following two problems.

A first problem will be described with reference to FIG. 31. FIG. 31 is a cross section illustrating the reproducing head manufactured by the method shown in FIG. 28 through FIG. 30 in detail. According to the manufacturing method of FIG. 28 through FIG. 30, a region on top of the protection layer 107 near the root portion of the mask 114 is less exposed to ion beams during the ion beam deposition shown in FIG. 29. Accordingly, as shown in FIG. 31, portions of the electrode layers 113 formed on the protection layer 107 become thinner than the other portions thereof.

Additionally, in the manufacturing method shown in FIG. 28 through FIG. 30, after the protection layer 107 is formed, the laminate is exposed to air in order to form the mask 114 on the protection layer 107. As a result, an upper part of the protection layer 107 is oxidized to form an oxide layer 117. Given that the protection layer 107 is made of Ta, the oxide layer 117 is of $TaO_2$.

For these reasons, the reproducing head manufactured by the method shown in FIG. 28 through FIG. 30 has greater ohmic resistances between the electrode layers 113 and the MR element 106 near the portions of the electrode layers 113 located on the protection layer 107. As a result, this reproducing head has the problem that less current flows between the MR element 106 and the portions of the electrode layers 133 located on the protection layer 107, and the effect of the overlapping electrode layer structure against a drop in output of reproducing heads is thereby hampered.

To solve the above-mentioned problem, it is conceivable to remove the oxide layer 117 near the root portion of the mask 114 by dry etching before the electrode-to-be film 113P is formed. To do so, for easy removal of the oxide layer 117, it is preferable that the root portion of the mask 114 having a T-shaped cross section be made greater in height. However, this causes the following problem in turn.

The problem will be described with reference to FIGS. 32 and 33. FIG. 32 is a cross section illustrating in detail a laminate obtained after the electrode-to-be film 113P is formed by the step shown in FIG. 29. As shown in FIG. 32, the ion beam deposition forms the electrode-to-be film 113P even on the side surfaces of the root portion of the mask 114. Hereinafter, the portions of the electrode-to-be film 113P that are formed on the side surfaces of the root portion of the mask 114 will be referred to as sidewall portions 118.

As shown in FIG. 33, after the mask 114 is lifted off, the sidewall portions 118, which are electrically conductive, remain on the protection layer 107. The sidewall portions 118 can come into contact with the top shield layer to cause a short between the top shield layer and the MR element 106.

OBJECT AND SUMMARY OF THE INVENTION

It is an object of the invention to provide a magnetoresistive device, a thin-film magnetic head, and methods of manufacturing the same which make it possible to precisely define a track width for reading, even if it is small, and to improve sensitivity, output, and output stability.

A magnetoresistive device of the invention comprises:

a magnetoresistive element having two surfaces that face toward opposite directions and two side portions;

a pair of bias field applying layers that are adjacent to the side portions of the magnetoresistive element and apply a bias magnetic field to the magnetoresistive element; and a pair of electrode layers that feed a current used for signal detection to the magnetoresistive element, each of the electrode layers being adjacent to one of surfaces of each of the bias field applying layers and overlapping one of the surfaces of the magnetoresistive element.

A thin-film magnetic head of the invention comprises:

a medium facing surface that faces toward a recording medium;

a magnetoresistive element located near the medium-facing surface and having two surfaces that face toward opposite directions and two side portions;

a pair of bias field applying layers that are adjacent to the side portions of the magnetoresistive element and apply a bias magnetic field to the magnetoresistive element; and a pair of electrode layers that feed a current used for signal detection to the magnetoresistive element, each of the electrode layers being adjacent to one of surfaces of each of the bias field applying layers and overlapping one of the surfaces of the magnetoresistive element.

In the magnetoresistive device or the thin-film magnetic head of the invention, the pair of electrode layers include: a pair of first layers each being laid over part of the one of the surfaces of the magnetoresistive element; a pair of second layers overlapping the pair of first layers and electrically connected to the first layers; and a pair of third layers laid over at least part of the pair of second layers respectively and electrically connected to the second layers, and, the second layers are smaller than the third layers in thickness.

According to the magnetoresistive device or the thin-film magnetic head of the invention, to form the electrode layers, an electrode-to-be film that is to be the first layers of the electrode layers is formed on the magnetoresistive element; the second and third layers are then formed on the electrode-to-be film; and the electrode-to-be film is patterned by etching using the second layers as masks, to thereby make the first layers.

The magnetoresistive device or the thin-film magnetic head of the invention may further comprise a protection layer for protecting the magnetoresistive element, the protection layer being located between the one of the surfaces of the magnetoresistive element and the first layers.

In the magnetoresistive device or the thin-film magnetic head of the invention, the pair of first layers may have a pair of first end portions opposed to each other; the pair of second layers may have a pair of second end portions opposed to each other; the pair of third layers may have a pair of third end portions opposed to each other; and the pair of second end portions may be located closer to a central position between the pair of second end portions than the pair of third end portions are. In this case, the pair of first end portions may be inclined such that the distance between the pair of first end portions increases with increasing distance from the one of the surfaces of the magnetoresistive element.

In the magnetoresistive device or the thin-film magnetic head of the invention, the pair of first layers may have a pair of side portions located at positions corresponding to the side portions of the magnetoresistive element; the pair of side portions of the pair of first layers may be inclined such that the distance between the pair of side portions decreases with increasing distance from the one of the surfaces of the magnetoresistive element; and each of the pair of side portions of the pair of first layers may form an angle with respect to the direction perpendicular to the one of the surfaces of the magnetoresistive element, the angle being greater than an angle formed by each of the side portions of the magnetoresistive element with respect to the direction perpendicular to the one of the surfaces of the magnetoresistive element.

The magnetoresistive device or the thin-film magnetic head of the invention may further comprise: a first insulating layer covering the third layers; a second insulating layer covering the first layers, the second layers, and the first insulating layer; and a shield layer adjacent to a surface of the second insulating layer opposite from the first insulating layer.

A magnetoresistive device manufactured by a method of manufacturing a magnetoresistive device of the invention comprises:

a magnetoresistive element having two surfaces that face toward opposite directions and two side portions;

a pair of bias field applying layers that are adjacent to the side portions of the magnetoresistive element and apply a bias magnetic field to the magnetoresistive element;

a pair of electrode layers that feed a current used for signal detection to the magnetoresistive element, each of the electrode layers being adjacent to one of surfaces of each of the bias field applying layers and overlapping one of the surfaces of the magnetoresistive element; and a protection layer for protecting the magnetoresistive element, the protection layer being located between the one of the surfaces of the magnetoresistive element and the electrode layers, wherein the pair of electrode layers include: a pair of first layers each being laid over part of the one of the surfaces of the magnetoresistive element; a pair of second layers overlapping the pair of first layers and electrically connected to the first layers; and a pair of third layers laid over at least part of the pair of second layers respectively and electrically connected to the second layers.

A thin-film magnetic head manufactured by a method of manufacturing a thin-film magnetic head of the invention comprises:

a medium facing surface that faces toward a recording medium;

a magnetoresistive element located near the medium-facing surface and having two surfaces that face toward opposite directions and two side portions;

a pair of bias field applying layers that are adjacent to the side portions of the magnetoresistive element and apply a bias magnetic field to the magnetoresistive element;

a pair of electrode layers that feed a current used for signal detection to the magnetoresistive element, each of the electrode layers being adjacent to one of surfaces of each of the bias field applying layers and overlapping one of the surfaces of the magnetoresistive element; and a protection layer for protecting the magnetoresistive element, the protection layer being located between the one of the surfaces of the magnetoresistive element and the electrode layers, wherein the pair of electrode layers include: a pair of first layers each being laid over part of the one of the surfaces of the magnetoresistive element; a pair of second layers overlapping the pair of first layers and electrically connected to the first layers; and a pair of third layers laid over at least part of the pair of second layers respectively and electrically connected to the second layers.

The method of manufacturing the magnetoresistive device or the method of manufacturing the thin-film magnetic head of the invention comprises the steps of:

forming an element-to-be film that is to be the magnetoresistive element;

forming the protection layer on the element-to-be film;

forming a first electrode-to-be film that is to be the first layers of the electrode layers on the protection layer, continuously after the step of forming the protection layer, without interposing a step of exposing the protection layer to the air;

forming a mask on the first electrode-to-be film, for patterning the first electrode-to-be film, the protection layer, and the element-to-be film by etching;

patterning the first electrode-to-be film, the protection layer, and the element-to-be film by etching using the mask;

forming the bias field applying layers with the mask left unremoved;

forming the second layers of the electrode layers on the bias field applying layers with the mask left unremoved;

forming the third layers of the electrode layers on the second layers with the mask left unremoved; and patterning the first electrode-to-be film by etching using the second layers as masks, in order to make the first layers.

In the method of manufacturing the magnetoresistive device or the method of manufacturing the thin-film magnetic head of the invention, the second layers may be smaller than the third layers in thickness.

In the method of manufacturing the magnetoresistive device or the method of manufacturing the thin-film magnetic head of the invention, the pair of first layers may have a pair of first end portions opposed to each other; the pair of second layers may have a pair of second end portions opposed to each other; the pair of third layers may have a pair of third end portions opposed to each other; and the pair of second end portions may be located closer to a central position between the pair of second end portions than the pair of third end portions are. In this case, the pair of first end portions may be inclined such that the distance between the pair of first end portions increases with increasing distance from the one of the surfaces of the magnetoresistive element.

The method of manufacturing the magnetoresistive device or the method of manufacturing the thin-film magnetic head of the invention may further comprise the step of etching two side portions of the first electrode-to-be film located at positions corresponding to the side portions of the magnetoresistive element, between the step of forming the bias field applying layers and the step of forming the second layers. Having gone through the step of etching, the side portions of the first electrode-to-be film are inclined such that the distance between the side portions decreases with increasing distance from the one of the surfaces of the magnetoresistive element; and each of the side portions of the first electrode-to-be film forms an angle with respect to the direction perpendicular to the one of the surfaces of the magnetoresistive element, the angle being greater than an angle formed by each of the side portions of the magnetoresistive element with respect to the direction perpendicular to the one of the surfaces of the magnetoresistive element.

The method of manufacturing the magnetoresistive device or the method of manufacturing the thin-film magnetic head of the invention may further comprise the step of selectively removing portions of the bias field applying layers located on the first electrode-to-be film, between the step of forming the bias field applying layers and the step of forming the second layers.

The method of manufacturing the magnetoresistive device or the method of manufacturing the thin-film magnetic head of the invention may further comprise the step of forming a coating layer to cover the third layers with the mask left unremoved, between the step of forming the third layers and the step of patterning the first electrode-to-be film.

Other and further objects, features and advantages of the invention will appear more fully from the following description.

DETAILED DESCRIPTION OF THE PREFERRED EMBODIMENTS

Embodiments of the invention will now be described in detail with reference to the accompanying drawings.

[First Embodiment]

Figure 1:
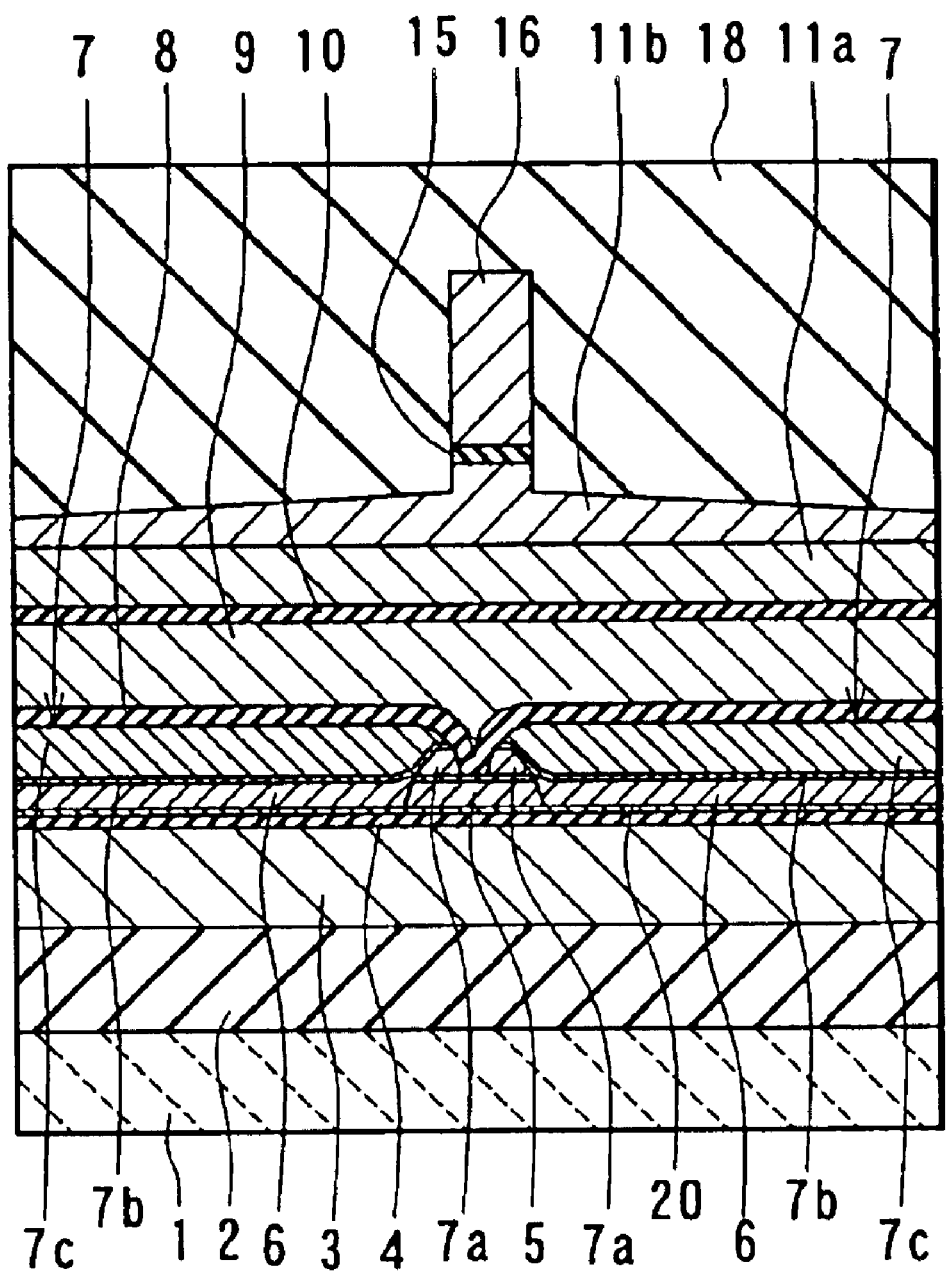
FIG. 1 is a cross section of a magnetic pole portion of a thin-film magnetic head of a first embodiment of the invention that is parallel to an air bearing surface.
Figure 2:
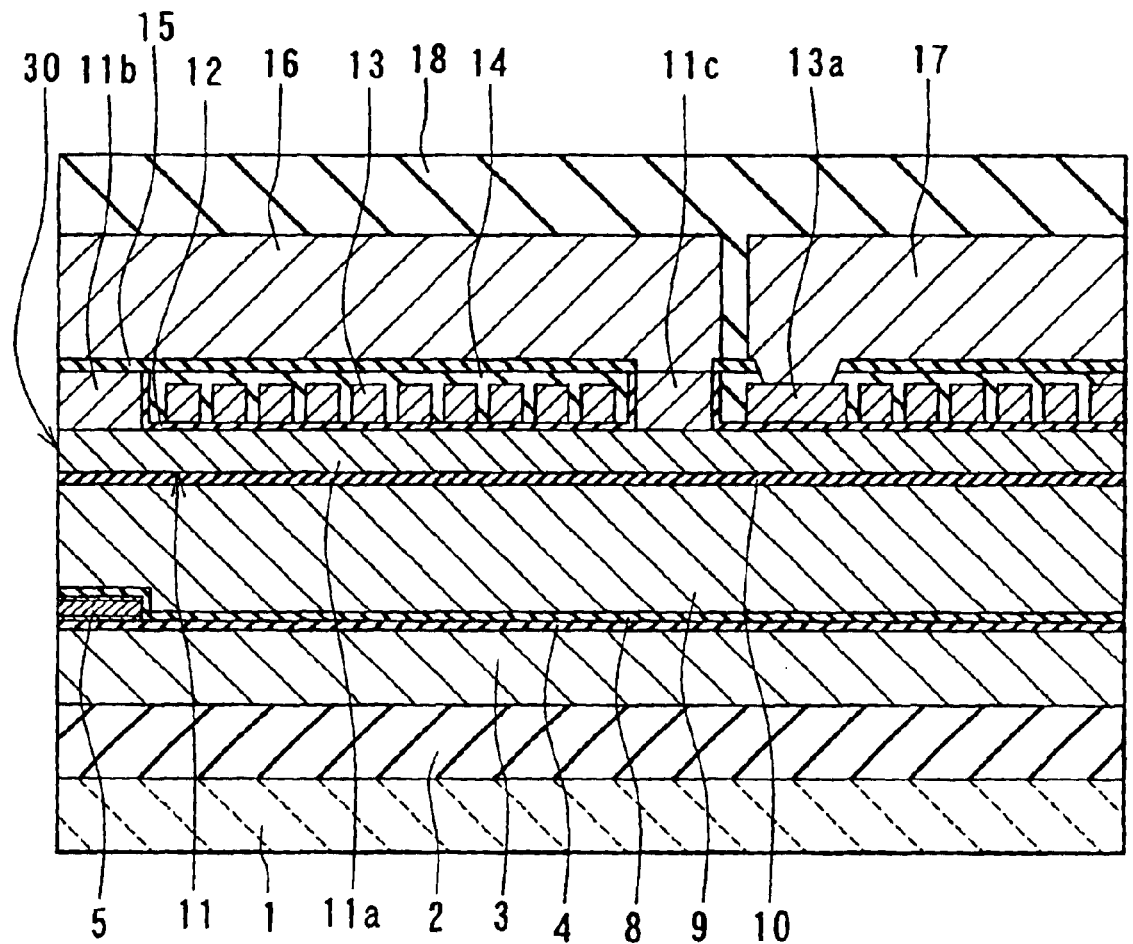
FIG. 2 is a cross section of the thin-film magnetic head of the first embodiment of the invention that is orthogonal to the air bearing surface and a top surface of a substrate.

Reference is now made to FIGS. 1 and 2 to describe a thin-film magnetic head and a method of manufacturing the same of a first embodiment of the invention. FIG. 1 is a cross section of magnetic pole portion of the thin-film magnetic head parallel to the air bearing surface. FIG. 2 is a cross section of the thin-film magnetic head orthogonal to the air bearing surface and the top surface of the substrate.

In the method of manufacturing the thin-film magnetic head of the embodiment, first, an insulating layer 2 made of alumina ($Al_2O_3$), for example, is formed on a substrate 1 made of aluminum oxide and titanium carbide ($Al_2O_3$—TiC), for example. Next, a bottom shield layer 3 of a magnetic material such as Permalloy (NiFe) is formed on the insulating layer 2. The bottom shield layer 3 is selectively formed on the insulating layer 2 by plating using a photoresist film as a mask, for example. Then, although not shown, an insulating layer of alumina, for example, is formed on the entire top surface of the laminate obtained through the steps so far. The insulating layer is then polished by chemical mechanical polishing (hereinafter referred to as CMP), for example, to expose the bottom shield layer 3, and the surface is thereby flattened. Then, a bottom shield gap film 4 serving as an insulating film is formed on the bottom shield layer 3.

On the bottom shield gap film 4, formed are an MR element 5 for magnetic signal detection, a pair of bias field applying layers 6 for applying a longitudinal bias field to the MR element 5, and a pair of electrode layers 7 to be electrically connected to the MR element 5. The MR element 5 is located near a region where to form an air bearing surface 30 to be described later. The MR element 5 has two surfaces that face toward opposite directions, and two side portions. The bias field applying layers 6 are located to be adjacent to the side portions of MR element 5, over the bottom shield gap film 4.

The electrode layers 7 feed a current used for signal detection (sense current) to the MR element 5. The electrode layers 7 are each located to be adjacent to one of surfaces (top surface) of each of the bias field applying layers 6 and to overlap one of the surfaces (top surface) of the MR element 5. The pair of electrode layers 7 include: a pair of first layers 7a each being laid over part of the one of the surfaces of the MR element 5; a pair of second layers 7b overlapping the pair of first layers 7a and electrically connected to the first layers 7a; and a pair of third layers 7c laid over at least part of the pair of second layers 7b respectively and electrically connected to the second layers 7b. The first, second and third layers 7a, 7b, and 7c are each made of a conductive material. The second layers 7b are smaller than the first layers 7a and the third layers 7c in thickness. The first, second and third layers 7a, 7b and 7c may be made of the same or different materials. The pair of first layers 7a have a pair of first end portions opposed to each other, the pair of second layers 7b have a pair of second end portions opposed to each other, and the pair of third layers 7c have a pair of third end portions opposed to each other. A method of forming the MR element 5, the bias field applying layers 6 and the electrode layers 7 will be detailed later.

Next, a top shield gap film 8 serving as an insulating film is formed on the entire top surface of the laminate. A top shield layer 9 of a magnetic material is then selectively formed on the top shield gap film 8. Then, although not shown, an insulating layer made of alumina, for example, is formed on the entire top surface of the laminate. The insulating layer is polished by CMP, for example, to expose the top shield layer 9, and the surface is thereby flattened.

Next, an insulating layer 10 made of alumina, for example, is formed on the entire top surface of the laminate. On the insulating layer 10, a first layer 11a of a bottom pole layer 11 is formed. On the first layer 11a, a second layer 11b and a third layer 11c of the bottom pole layer 11 are formed. The first, second, and third layers 11a, 11b, 11c are each made of a magnetic material. The second layer 11b makes the magnetic pole portion of the bottom pole layer 11, and is connected to a surface of the first layer 11a (the surface on the upper side in FIG. 2) that is closer to a recording gap layer to be described later. The third layer 11c serves as a portion for connecting the first layer 11a and a top pole layer to be described later to each other, and is located near the center of a thin-film coil to be described later. The second layer 11b has a portion opposed to the top pole layer, and the end of this portion farther from the air bearing surface 30 defines a throat height. The throat height is the length (height) of the magnetic pole portions, that is, the portions of the two pole layers opposed to each other with the recording gap layer in between, as taken from the end closer to the air bearing surface 30 to the other end.

Next, an insulating film 12 made of alumina, for example, is formed on the entire top surface of the laminate. A thin-film coil 13 made of copper (Cu), for example, is then formed on a portion of the insulating film 12 located on the first layer 11a. The thin-film coil 13 is formed by frame plating, for example. In FIG. 2, the reference numeral 13a represents a connecting portion for connecting the thin-film coil 13 to a lead to be described later.

Next, an insulating layer 14 made of alumina, for example, is formed on the entire top surface of the laminate. The insulating layer 14 is polished by CMP, for example, so that the second and third layers 11b and 11c of the bottom pole layer 11 are exposed, and the surfaces are thereby flattened.

Next, the recording gap layer 15 of an insulating material such as alumina is formed to cover the entire top surface of the laminate. Then, etching is performed to selectively remove portions of the recording gap layer 15 located on the third layer 11c of the bottom pole layer 11 and on the connecting portion 13a of the thin-film coil 13, and to remove a portion of the insulating layer 14 located on the connecting portion 13a. Contact holes are thereby formed over the third layer 11c and the connecting portion 13a.

Then, a top pole layer 16 patterned into a predetermined shape and a lead 17 are formed on the recording gap layer 15. They are each made of a magnetic material. The top pole layer 16 is connected to the third layer 11c through the contact hole located over the third layer 11c. The lead 17 is connected to the connecting portion 13a through the contact hole located over the connecting portion 13a.

The top pole layer 16 includes: a track width defining portion having one end located at the air bearing surface 30 and the other end located away from the air bearing surface 30; and a yoke portion coupled to the other end of the track width defining portion. The yoke portion has a width equal to that of the track width defining portion at the interface with the track width defining portion. The width of the yoke portion gradually increases from this interface with an increase in distance from the track width defining portion, and finally becomes constant. The track width defining portion is the magnetic pole portion of the top pole layer 16.

Next, the recording gap layer 15 is etched by using the top pole layer 16 as a mask. Then, using the track width defining portion of the top pole layer 16 as a mask, the second layer 11b of the bottom pole layer 11 is partially etched around the track width defining portion. The etching forms a trim structure as shown in FIG. 1, in which sidewalls of the magnetic pole portion of the top pole layer 16, the recording gap layer 15 and part of the bottom pole layer 11 are formed vertically in a self-aligned manner. The trim structure suppresses an increase in the effective track width due to expansion of a magnetic flux generated during writing in a narrow track. A portion of the second layer 11b that is opposed to the track width defining portion of the top pole layer 16 with the recording gap layer 15 in between is the magnetic pole portion of the bottom pole layer 11.

Next, an overcoat layer 18 made of alumina, for example, is formed to cover the entire top surface of the laminate. Its surface is flattened, and electrode pads that are not shown are formed thereon. Finally, lapping of the slider including the foregoing layers is performed to form the air bearing surface 30, thereby completing the thin-film magnetic head.

The thin-film magnetic head of this embodiment fabricated as described above comprises the air bearing surface 30 serving as a medium facing surface that faces toward a recording medium, a reproducing head (magnetoresistive device), and a recording head (induction-type electromagnetic transducer). The reproducing head incorporates: the MR element 5 located near the air bearing surface 30; the bottom shield layer 3 and the top shield layer 9 for shielding the MR element 5, portions of the bottom and top shield layers 3 and 9 located on a side of the air bearing surface 30 being opposed to each other with the MR element 5 in between; the bottom shield gap film 4 located between the MR element 5 and the bottom shield layer 3; and the top shield gap film 8 located between the MR element 5 and the top shield layer 9. The reproducing head further incorporates: a pair of bias field applying layers 6 located to be adjacent to the side portions of the MR element 5; and a pair of electrode layers 7 that are located on the bias field applying layers 6 and over the bottom shield gap film 4, and overlap the MR element 5. The reproducing head functions as the magnetoresistive device according to the embodiment, too.

The recording head incorporates: the bottom pole layer 11 and the top pole layer 16 magnetically coupled to each other and including the magnetic pole portions that are opposed to each other and located in regions of the pole layers on a side of the air bearing surface 30; the recording gap layer 15 provided between the magnetic pole portions of the bottom and top pole layers 11 and 16; and the thin-film coil 13 at least part of which is located between the bottom and top pole layers 11 and 16 and insulated from the bottom and top pole layers 11 and 16.

Figure 3:
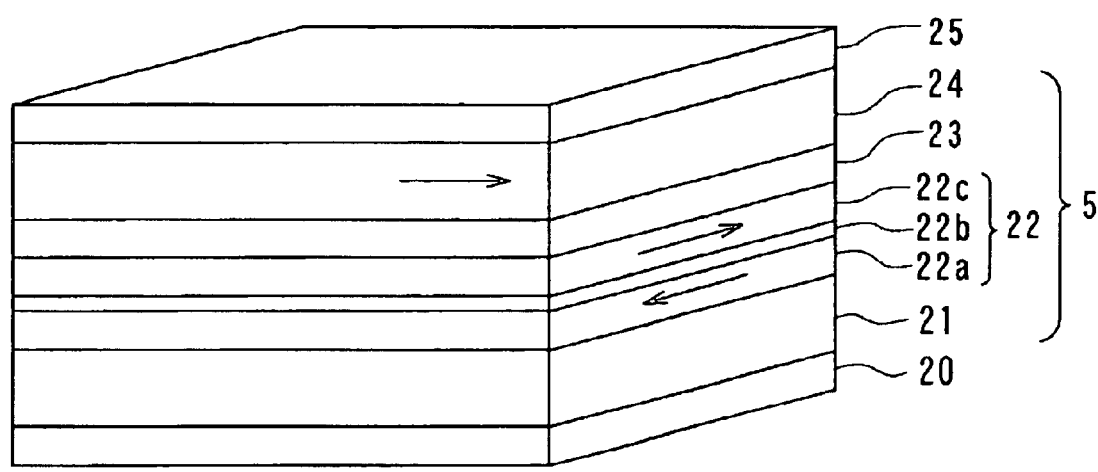
FIG. 3 is a perspective view that illustrates a configuration of an MR element in the first embodiment of the invention.

Reference is now made to FIG. 3 to describe the configuration of the MR element 5 in this embodiment. In FIG. 3, the arrows indicate the directions of magnetization by way of example. The MR element 5 is formed on a base layer 20 that is formed on the bottom shield gap film 4. The MR element 5 includes an antiferromagnetic layer 21, a pinned layer 22, a nonmagnetic conductive layer 23, and a free layer 24 that are laminated in this order on the base layer 20. The free layer 24 is covered with a protection layer 25. On the protection layer 25, part of the electrode layers 7 and the top shield gap film 8 are to placed.

The base layer 20 is provided for the purpose of attaining better orientation and magnetic properties of the antiferromagnetic layer 21. The base layer 20 may be made of a Ta or Cr compound, for example. The base layer 20 has a thickness of 5 nm, for example.

The antiferromagnetic layer 21 fixes the direction of magnetization of the pinned layer 22. The antiferromagnetic layer 21 is made of PtMn, for example. The antiferromagnetic layer 21 has a thickness of 25 nm, for example.

The pinned layer 22 is a layer whose direction of magnetization is fixed. The pinned layer 22 of the embodiment includes: a nonmagnetic spacer layer 22b; and two ferromagnetic layers 22a and 22c that sandwich the nonmagnetic spacer layer 22b. The pinned layer 22 is fabricated by stacking the ferromagnetic layer 22a, the nonmagnetic spacer layer 22b and the ferromagnetic layer 22c in this order on the antiferromagnetic layer 21. The two ferromagnetic layers 22a and 22c are antiferromagnetic-coupled to each other and exhibit magnetizations whose directions are fixed in opposite directions. The ferromagnetic layers 22a and 22c are each made of CoFe, for example. The nonmagnetic spacer layer 22b is made of Ru, for example. The ferromagnetic layer 22a has a thickness of 2 nm, for example. The nonmagnetic spacer layer 22b has a thickness of 0.8 nm, for example. The ferromagnetic layer 22c has a thickness of 2.5 nm, for example.

The nonmagnetic conductive layer 23 is made of Cu, for example. The nonmagnetic conductive layer 23 has a thickness of 2 nm, for example.

The free layer 24 is a layer in which the direction of magnetization varies in response to the signal magnetic field supplied from the recording medium. The free layer 24 is made of NiFe or CoFe, for example. The free layer 24 has a thickness of 2 to 3 nm, for example.

The protection layer 25 protects the films constituting the MR element 5 after the formation of these films. Thus, the protection layer 25 protects the MR element 5. This protection layer 25 is made of Ta, for example. The protection layer 25 has a thickness of 5 nm, for example.

Thus, the MR element 5 includes: the nonmagnetic conductive layer 23 having two surfaces that face toward opposite directions; the free layer 24 adjacent to one of the surfaces (top surface) of the nonmagnetic conductive layer 23; the pinned layer 22, located adjacent to the other one of the surfaces (bottom surface) of the nonmagnetic conductive layer 23, whose direction of magnetization is fixed; and the antiferromagnetic layer 21 that is adjacent to one of the surfaces of the pinned layer 22 farther from the nonmagnetic conductive layer 23 and fixes the direction of magnetization of the pinned layer 22.

Reference is now made to FIG. 4 through FIG. 12 to describe in detail the configuration of the reproducing head of this embodiment, that is, the magnetoresistive device of this embodiment, and the method of manufacturing the same. FIG. 4 through FIG. 12 are cross sections for illustrating the method of manufacturing the magnetoresistive device of the embodiment.

Figure 4:
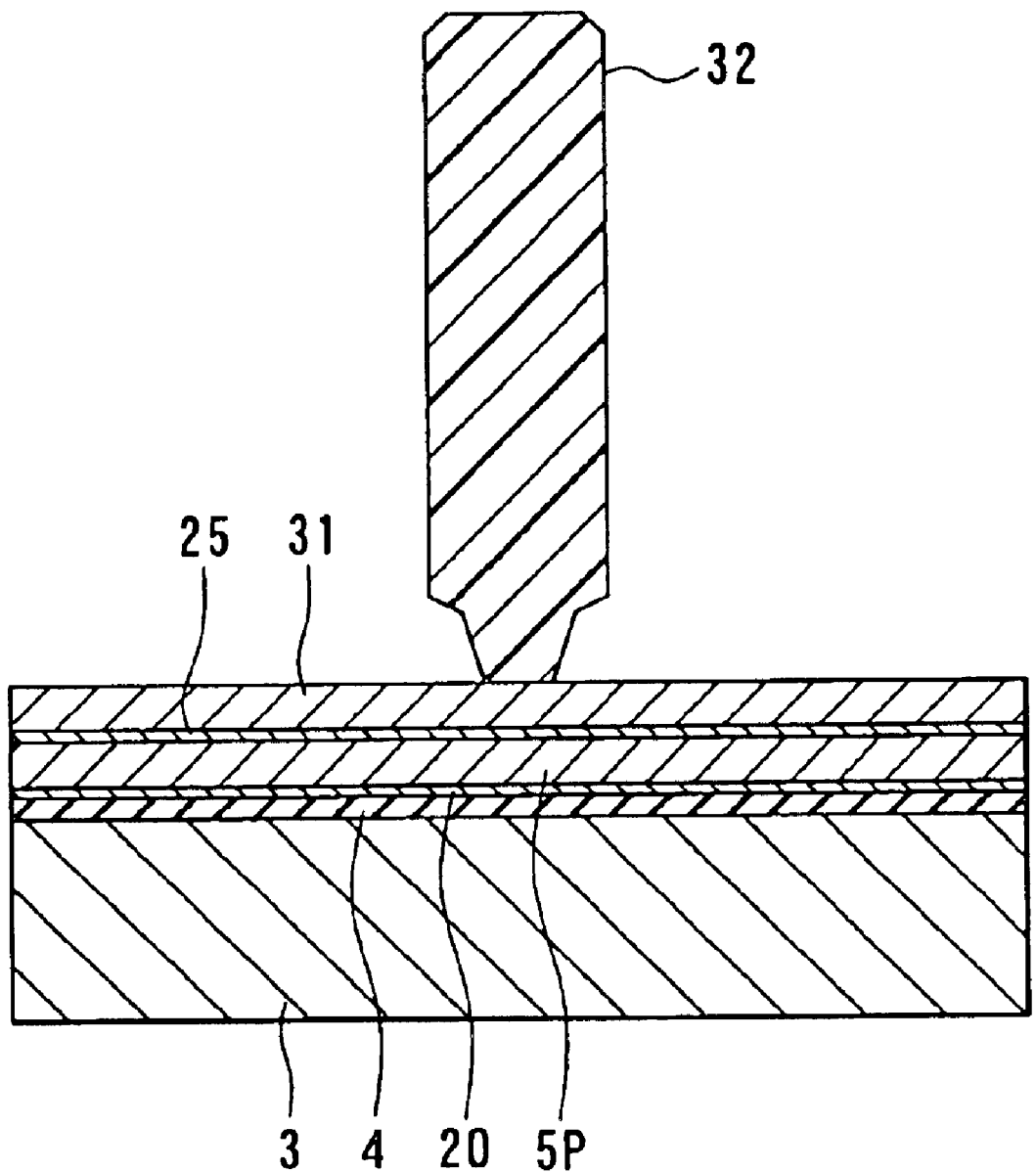
FIG. 4 is a cross section for illustrating a step of a method of manufacturing a magnetoresistive device of the first embodiment of the invention.

In the method of manufacturing the magnetoresistive device of the embodiment, first, as shown in FIG. 4, the base layer 20 is formed on the bottom shield gap film 4. Next, an MR-element-to-be film 5P to make the MR element 5 is formed on the base layer 20. The protection layer 25 is then formed on the MR-element-to-be film 5P. The MR-element-to-be film 5P is made of a plurality of layers whose arrangement, materials, and thicknesses are the same as those of the layers making up the MR element 5 described with reference to FIG. 3. The materials and thicknesses of the base layer 20 and the protection layer 25 are also the same as those of the base layer 20 and the protection layer 25 described with reference to FIG. 3.

Next, a first electrode-to-be film 31 to make the first layers 7a of the electrode layers 7 is formed on the protection layer 25. The electrode-to-be film 31 is made of Au, for example. The electrode-to-be film 31 has a thickness of 30 to 50 nm, for example.

The base layer 20, the MR-element-to-be film 5P, the protection layer 25, and the electrode-to-be film 31 are formed continuously in a vacuum by means of, e.g., sputtering, without interposing a step for atmospheric exposure.

Next, a mask 32 for patterning the electrode-to-be film 31, the protection layer 25, and the MR-element-to-be film 5P by etching is formed on the electrode-to-be film 31. The mask 32 is made of a photoresist layer patterned by photolithography. For easy lift-off, the mask 32 is formed to have a T-shaped cross section, i.e., such a shape that a portion close to the bottom is smaller in width than a portion close to the top. The mask 32 has a height of 600 nm, for example.

Figure 5:
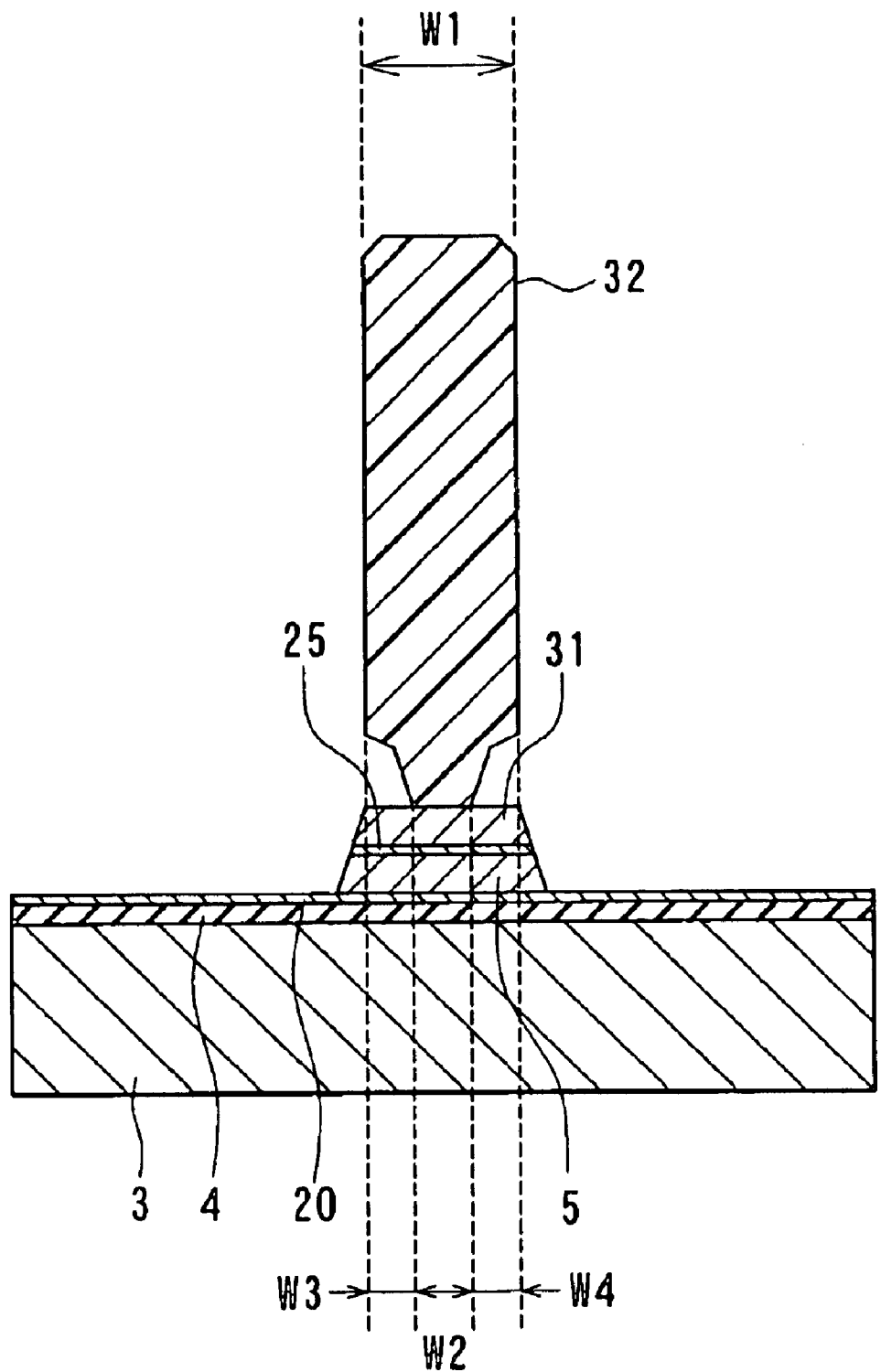
FIG. 5 is a cross section for illustrating a step that follows FIG. 4.

Next, as shown in FIG. 5, ion beam etching is performed so that ion beams travel at an angle of 5 to 10° with respect to the direction perpendicular to the top surface of the bottom shield layer 3, thereby partially etching the electrode-to-be film 31, the protection layer 25, and the MR-element-to-be film 5P. The electrode-to-be film 31, the protection layer 25, and the MR-element-to-be film 5P are thus patterned. The MR-element-to-be film 5P makes the MR element 5 as a result of the patterning. Both side portions of the MR element 5 are inclined such that the distance between the side portions decreases with increasing proximity to the top of the MR element 5.

Suppose, as shown in FIG. 5, that the top width of the mask 32 is W1 and the bottom width of the mask 32 is W2. The top surface of the electrode-to-be film 31 after the patterning has approximately the same width as W1. The distance from one end of the bottom of the mask 32 along the width thereof to one end of the top surface of the electrode-to-be film 31 along the width thereof shall be W3. The distance from the other end of the bottom of the mask 32 along the width thereof to the other end of the top surface of the electrode-to-be film 31 along the width thereof shall be W4. For example, W1, W2, W3, and W4 are 0.13 $\mu$m, 0.05 $\mu$m, 0.04 $\mu$m, and 0.04 $\mu$m, respectively. To attain a smaller track width of the reproducing head, W1, W2, W3, and W4 may be 0.06 $\mu$m, 0.02 $\mu$m, 0.02 $\mu$m, and 0.02 $\mu$m, respectively.

Figure 6:
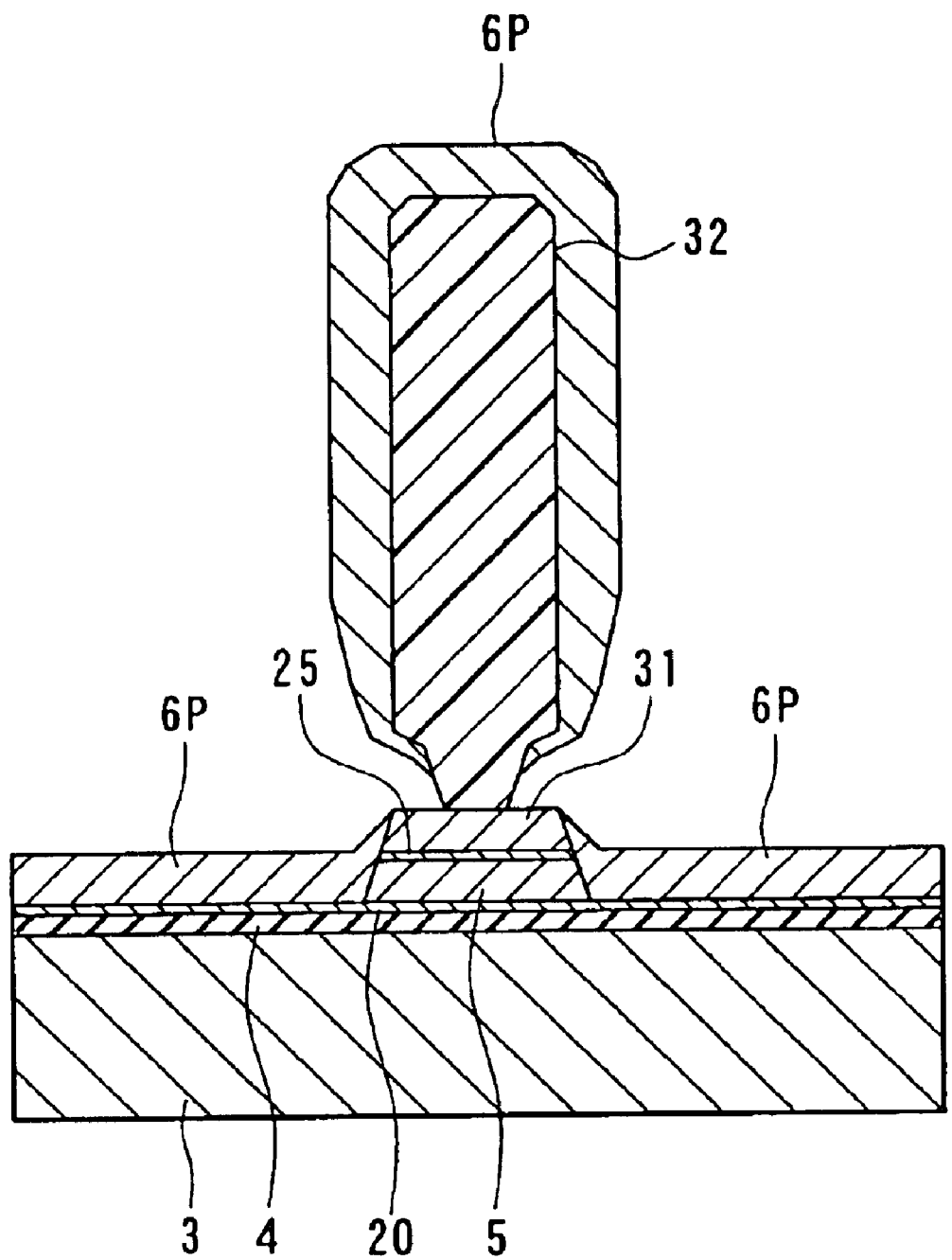
FIG. 6 is a cross section for illustrating a step that follows FIG. 5.

Next, as shown in FIG. 6, ion beam deposition is performed with the mask 32 left unremoved, so that ion beams travel at an angle of 0 to 5° with respect to the direction perpendicular to the top surface of the bottom shield layer 3. A hard magnetic layer 6P for forming the bias field applying layers 6 is thereby formed on the entire top surface of the laminate. The hard magnetic layer 6P is made of CoPt, for example. The hard magnetic layer 6P has a thickness of 40 to 60 nm, for example.

Figure 7:
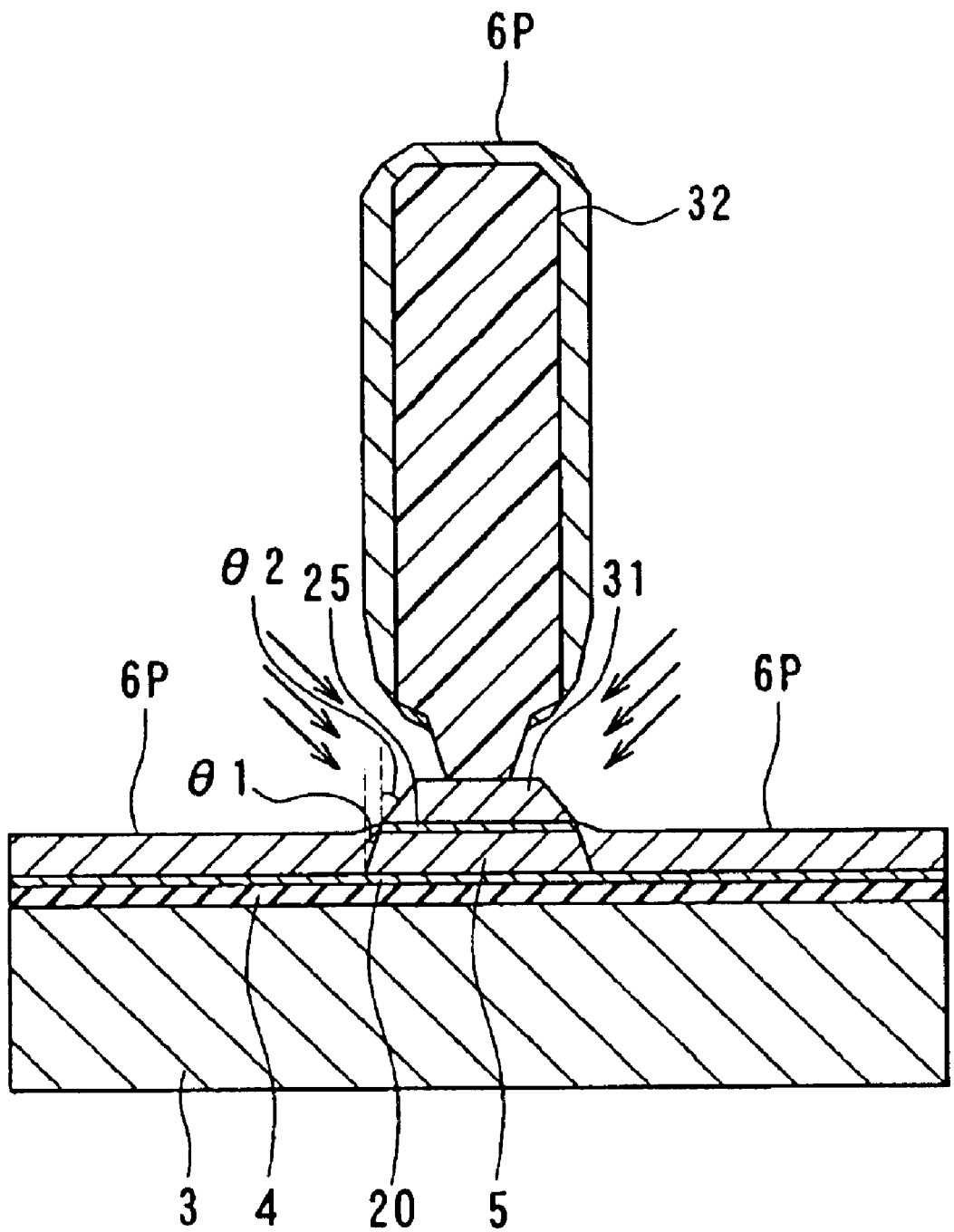
FIG. 7 is a cross section for illustrating a step that follows FIG. 6.

Next, as shown in FIG. 7, ion beam etching is performed so that ion beams travel at an angle of 30° to 75° with respect to the direction perpendicular to the top surface of the bottom shield layer 3, thereby selectively removing portions of the hard magnetic layer 6P located on the electrode-to-be film 31 and portions thereof adhering to the side portions of the electrode-to-be film 31. The arrows in FIG. 7 represent ion beams. This ion beam etching also etches the side portions of the electrode-to-be film 31. Specifically, the side portions of the electrode-to-be film 31 are etched such that the etching depth becomes greater with increasing proximity to the top of the electrode-to-be film 31. As a result, as shown in FIG. 7, the side portions of the electrode-to-be film 31 are inclined such that the distance between the side portions decreases with increasing proximity to the top of the electrode-to-be film 31. Each of the side portions of the electrode-to-be film 31 forms an angle $\theta 2$ with respect to the direction perpendicular to the top surface of the MR element 5, the angle $\theta 2$ being greater than the angle $\theta 1$ formed by each of the side portions of the MR element 5 with respect to the direction perpendicular to the top surface of the MR element 5.

Figure 8:
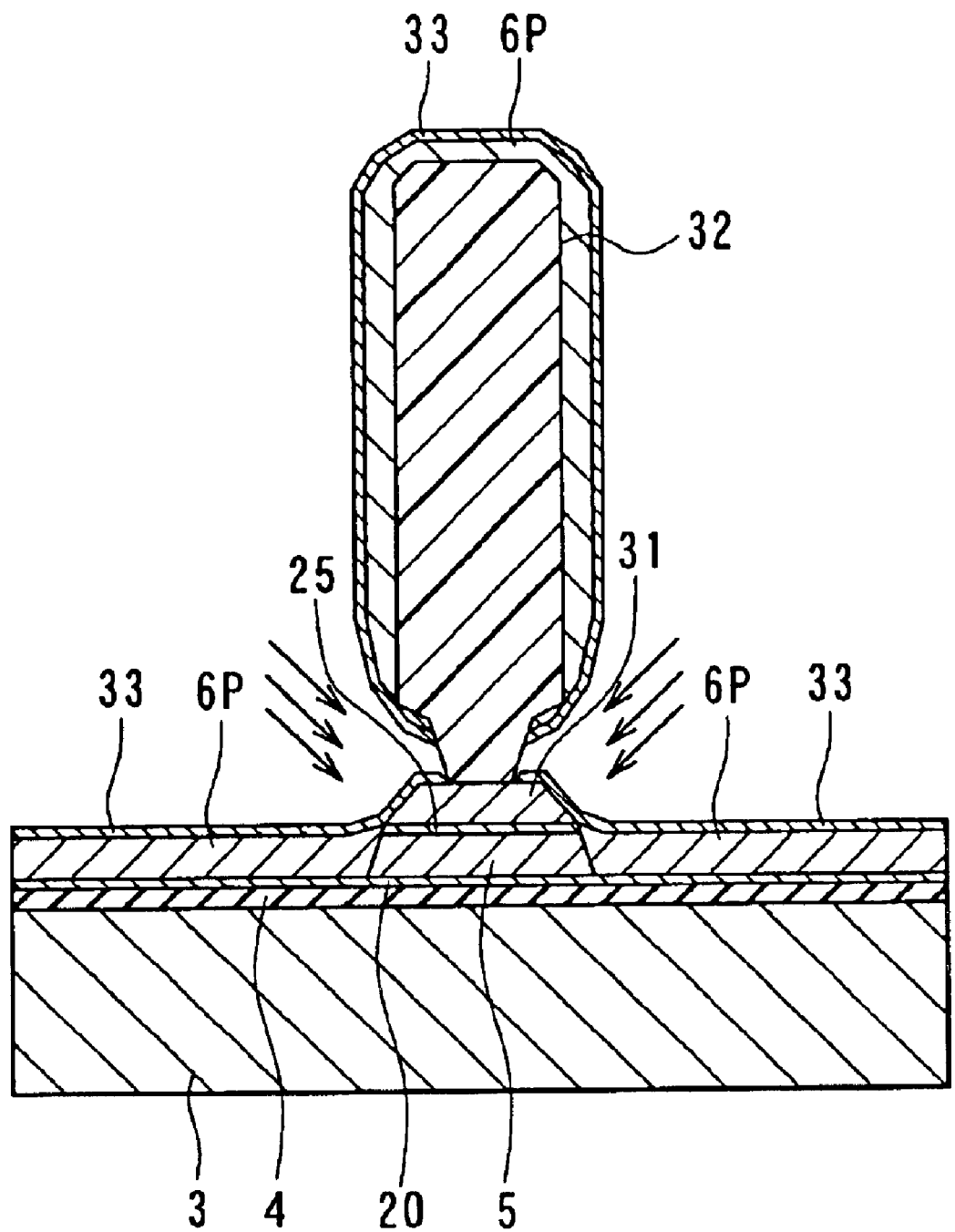
FIG. 8 is a cross section for illustrating a step that follows FIG. 7.

Next, as shown in FIG. 8, ion beam deposition is performed with the mask 32 left unremoved, so that ion beams travel aslant with respect to the direction perpendicular to the top surface of the bottom shield layer 3. A second electrode-to-be film 33 to make the second layers 7b of the electrode layers 7 is thereby formed on the entire top surface of the laminate. The traveling direction of the ion beams forms an angle of, e.g., 40° to 75°, with respect to the direction perpendicular to the top surface of the bottom shield layer 3. The ion beams may be allowed to sweep so that the angle formed between the traveling direction of the ion beams and the direction perpendicular to the top surface of the bottom shield layer 3 changes within a range of 10° to 75°, for example. The electrode-to-be film 33 may be made of a metal material with a high melting point. Such a metal material may be, for example, Ta, Mo, W, Ni, Cr, Ti, TiW, or TaN. The electrode-to-be film 33 has a thickness smaller than that of a third electrode-to-be film 34 to be described later. The thickness of the electrode-to-be film 33 is, for example, 5 to 6 nm. In FIG. 8, the arrows represent ion beams.

The electrode-to-be film 33 is formed to cover the top surface of the hard magnetic layer 6P, the side portions of the electrode-to-be film 31, and part of the top surface of the electrode-to-be film 31 that is not covered with the mask 32. On top of the electrode-to-be film 31, the ends of the electrode-to-be film 33 are in contact with the side portions of the mask 32.

Figure 9:
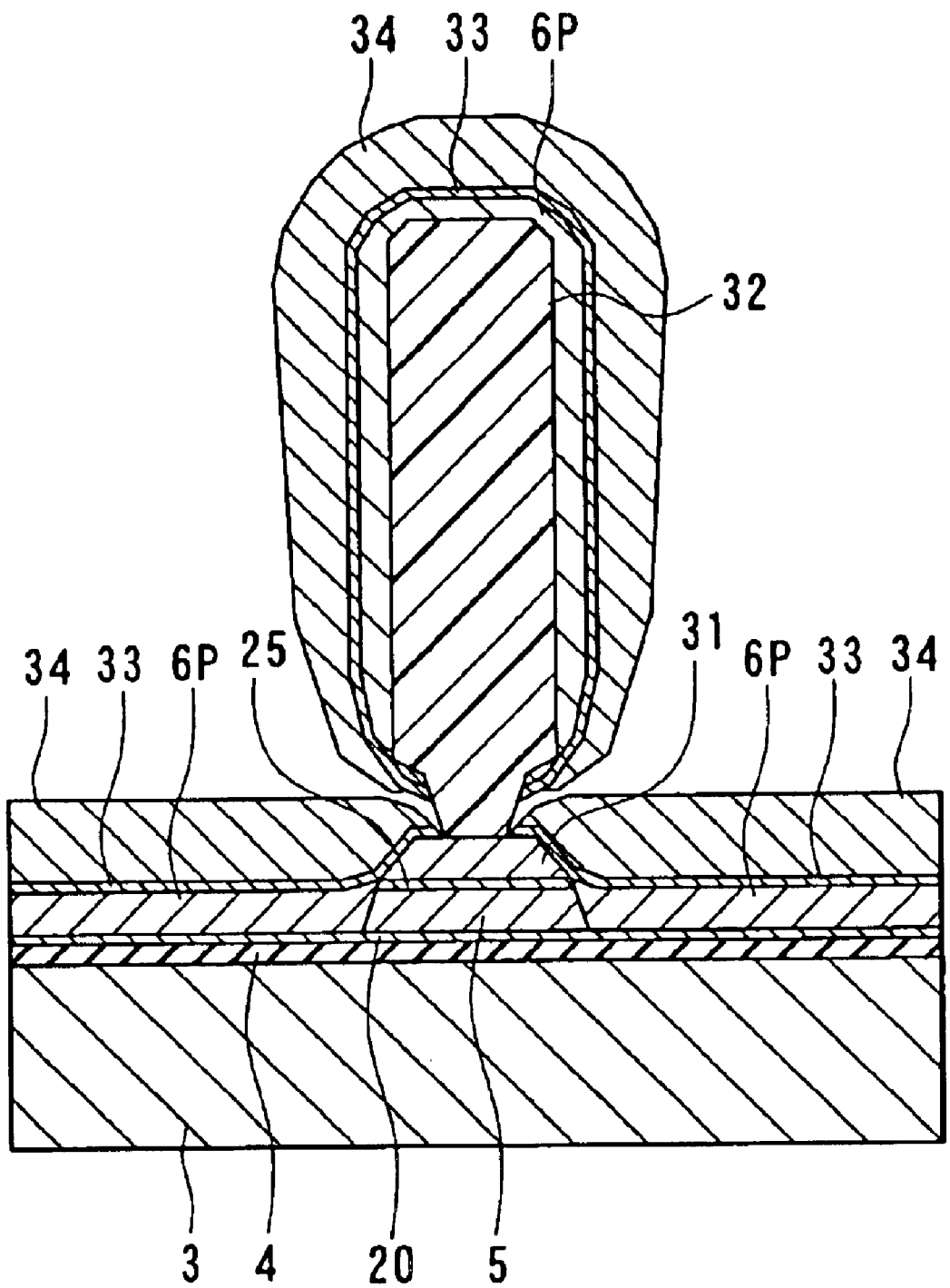
FIG. 9 is a cross section for illustrating a step that follows FIG. 8.

Next, as shown in FIG. 9, ion beam deposition is performed so that the third electrode-to-be film 34 to make the third layers 7c of the electrode layers 7 is formed on the entire top surface of the laminate. The electrode-to-be film 34 is made of Au, for example. The electrode-to-be film 34 has a thickness of 50 to 80 nm, for example. The electrode-to-be film 34 is located on the electrode-to-be film 33 such that the ends of the electrode-to-be film 33 located near the bottom of the mask 32 on top of electrode-to-be film 31 are exposed from the ends of the electrode-to-be film 34.

Figure 10:
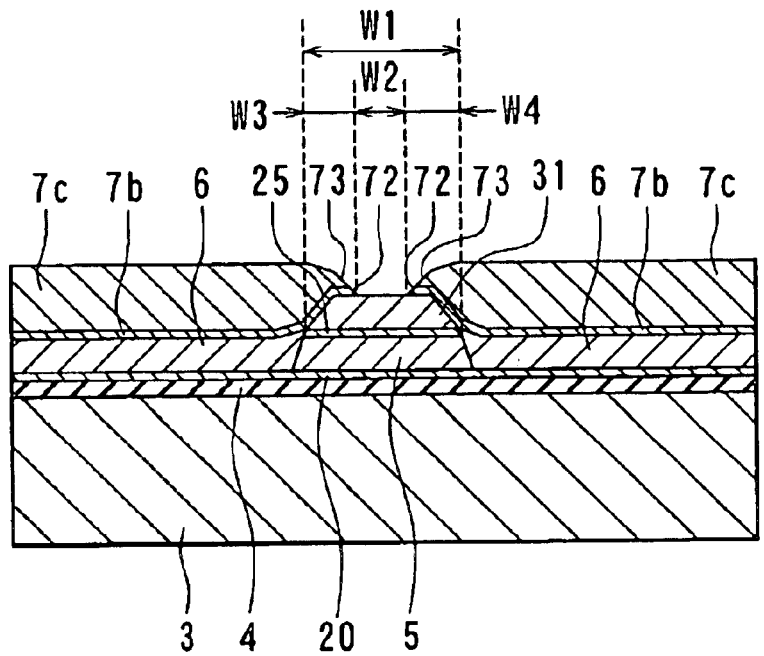
FIG. 10 is a cross section for illustrating a step that follows FIG. 9.

Next, as shown in FIG. 10, the mask 32 is lifted off. As a result, the remaining portions of the hard magnetic layer 6P make a pair of bias field applying layers 6; the remaining portions of the electrode-to-be film 33 make a pair of second layers 7b; and the remaining portions of the electrode-to-be film 34 make a pair of third layers 7c. Portions of the pair of second layers 7b located on the electrode-to-be film 31 are separated from each other with a predetermined space interposed therebetween. The pair of second layers 7b have a pair of second end portions 72 that are opposed to each other on the electrode-to-be film 31. Similarly, the pair of third layers 7c have a pair of third end portions 73 that are opposed to each other on the electrode-to-be film 31. On the electrode-to-be film 31, the pair of end portions 72 of the pair of second layers 7b are exposed from the pair of end portions 73 of the pair of third layers 7c, and are located closer to the central position between the pair of end portions 72 of the second layers 7b than the pair of end portions 73 of the third layers 7c are. The space between the pair of end portions 72 of the pair of second layers 7b is approximately equal to the bottom width W2 of the mask 32 shown in FIG. 5. The width of the top surface of the MR element 5 is approximately equal to the top width W1 of the mask 32 shown in FIG. 5. The distance from the end portion 72 of one of the second layers 7b located on the electrode-to-be film 31 to one end of the top surface of the MR element 5 along the width thereof is approximately the same as the distance W3 shown in FIG. 5. Similarly, the distance from the end portion 72 of the other of the second layers 7b located on the electrode-to-be film 31 to the other end of the top surface of the MR element 5 along the width thereof is approximately the same as the distance W4 shown in FIG. 5.

Figure 11:
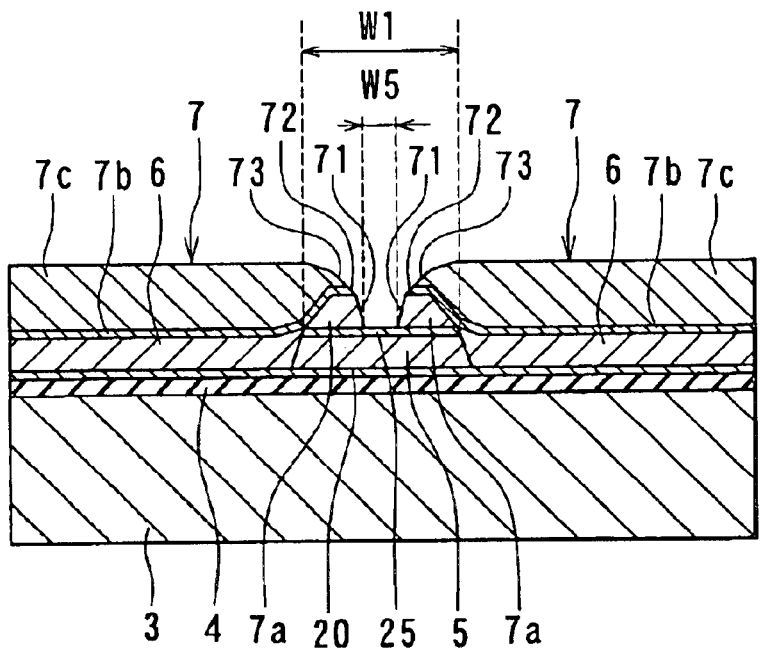
FIG. 11 is a cross section for illustrating a step that follows FIG. 10.

Next, as shown in FIG. 11, the electrode-to-be film 31 is partially etched by dry etching with the second layers 7b as masks. As a result, portions of the electrode-to-be film 31 remaining under the second layers 7b make a pair of first layers 7a. The pair of first layers 7a have a pair of first end portions 71 opposed to each other. The space W5 between the pair of first end portions 71 measured on the top surface of the protection layer 25 defines the optical track width of the reproducing head. The etching of the electrode-to-be film 31 may be ion beam etching, sputter etching, reactive sputter etching, reactive ion etching, or plasma etching. The sputter etching may be of various types such as a direct current (DC) magnetron type and a radio frequency (RF) type. The etching of the electrode-to-be film 31 is performed in such gas as Ar, He, and Kr. Here, by way of example, sputter etching using argon gas ions shall be performed in a parallel plate sputter etching system to etch the electrode-to-be film 31. As shown in FIG. 11, the etching of the electrode-to-be film 31 may be performed to cause the space between the pair of end portions 71 of the pair of first layers 7a to increase with increasing distance from the top surface of the MR element 5. In this case, the space W5 between the pair of first end portions 71 measured on the top surface of the protection layer 25 is smaller than the space W2 (see FIG. 10) between the pair of end portions 72 of the pair of second layers 7b. For example, W5 is 0.02 to 0.03 $\mu$m. On the top surface of the protection layer 25, the pair of first layers 7a have the same width.

Figure 12:
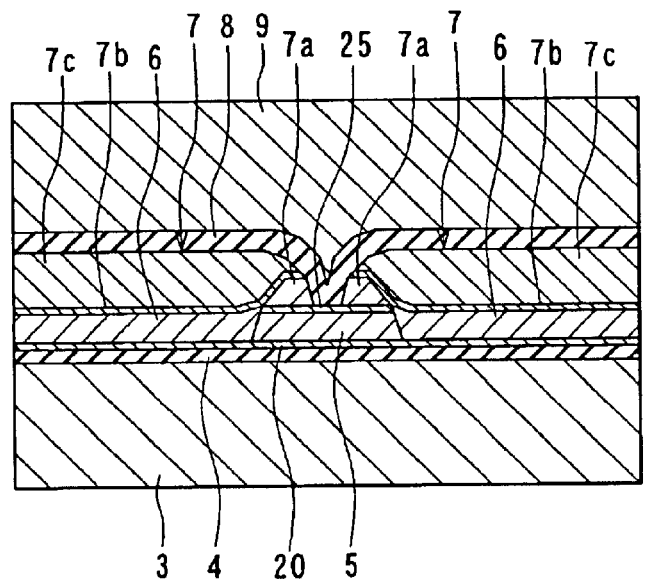
FIG. 12 is a cross section for illustrating a step that follows FIG. 11.

Next, as shown in FIG. 12, the top shield gap film 8 is formed on the entire top surface of the laminate. The top shield layer 9 is then formed on the entire top surface of the laminate. The top shield gap film 8 has a thickness of 20 nm, for example. The top shield layer 9 has a thickness of 1.8 $\mu$m, for example.

As has been described, according to the magnetoresistive device, the thin-film magnetic head, and the methods of manufacturing the same of the embodiment, the pair of bias field applying layers 6 are provided to be adjacent to the side portions of the MR element 5, and the pair of electrode layers 7 are provided to overlap the top surface of the MR element 5. According to the embodiment, it is thereby possible to reduce Barkhausen noise while preventing a reduction in output of the magnetoresistive device (reproducing head). The magnetoresistive device (reproducing head) can thus be improved in sensitivity, output, and output stability.

In this embodiment, the pair of electrode layers 7 include: the pair of first layers 7a each being laid over part of the one of the surfaces (top surface) of the MR element 5 via the protection layer 25; the pair of second layers 7b overlapping the pair of first layers 7a and electrically connected to the first layers 7a; and the pair of third layers 7c laid over at least part of the pair of second layers 7b respectively and electrically connected to the second layers 7b. The second layers 7b are smaller than the third layers 7c in thickness. The pair of first layers 7a have the pair of first end portions 71 opposed to each other; the pair of second layers 7b have the pair of second end portions 72 opposed to each other; and the pair of third layers 7c have the pair of third end portions 73 opposed to each other. The pair of second end portions 72 are located closer to the central position between the pair of end portions 72 than the pair of end portions 73 are. The pair of first layers 7a have a pair of side portions located at positions corresponding to the side portions of the MR element 5. The pair of side portions of the pair of first layers 7a are inclined such that the distance between the pair of side portions decreases with increasing distance from the top surface of the MR element 5.

In this embodiment, by making the electrode layers 7 to have the above-mentioned structure, it becomes possible to form the protection layer 25 and the electrode-to-be film 31 continuously and to pattern the MR elements 5, the bias field applying layers 6, and the electrode layers 7 in a self-aligned manner by using a single mask 32.

Specifically, in the embodiment, the protection layer 25 and the electrode-to-be film 31 are continuously formed in a vacuum without interposing a step of exposing the protection layer 25 to the air. Thereafter, in the embodiment, the single mask 32 is used to pattern the MR element 5 and to form the bias field applying layers 6, the second layers 7b, and the third layers 7c. Furthermore, in the embodiment, the electrode-to-be film 31 is partially etched by using the second layers 7b as masks, so that portions of the electrode-to-be film 31 remaining under the second layers 7b after the etching make the first layers 7a of the electrode layers 7. Thus, according to the embodiment, it is possible to prevent an increase in ohmic resistance between the electrode layers 7 and the MR element 5 that would be caused by oxidation of the protection layer 25. As a result, it is possible to prevent the advantageous effects of the overlapping electrode layer structure from being hampered.

According to the embodiment, the MR element 5, the bias field applying layers 6, and the electrode layers 7 are patterned in a self-aligned manner by using the single mask 32. Thus, according to the embodiment, it is possible to precisely locate the electrode layers 7 at positions as designed. Consequently, the embodiment makes it possible to precisely define the track width, even if it is small, of the reproducing head for reading, and to prevent the advantageous effects of the overlapping electrode layer structure from being hampered.

In the embodiment, the track width of the reproducing head is defined by the space between the pair of first end portions 71 of the pair of first layers 7a. The positions of the pair of first end portions 71 are determined by the positions of the pair of second end portions 72 of the pair of second layers 7b.

In the embodiment, the second electrode-to-be film 33 to be the second layers 7b has a thickness smaller than that of the third electrode-to-be film 34 to be the third layers 7c. This facilitates forming the electrode-to-be film 33 so that the ends of the electrode-to-be film 33 are precisely located in position on top of the electrode-to-be film 31 so as to be in contact with the side portions of the mask 32. As a result, according to the embodiment, it is possible to precisely control the positions of the pair of second end portions 72. In the embodiment, the pair of second end portions 72 are located closer to the central position between the pair of second end portions 72 than the pair of third end portions 73 of the third layers 7c are. Consequently, the pair of second end portions 72 serve to define the track width of the reproducing head precisely. Thus, the embodiment makes it possible to define even a small track width of the reproducing head with high precision.

In the embodiment, after forming the hard magnetic layer 6P, the side portions of the electrode-to-be film 31 located at positions corresponding to the side portions of the MR element 5 are etched so as to allow the side portions of the electrode-to-be film 31 to be inclined such that the distance between the side portions decreases with increasing distance from the top surface of the MR element 5. As a result, as shown in FIG. 7, the angle θ2 formed by each of the side portions of the electrode-to-be film 31 with respect to the direction perpendicular to the top surface of the MR element 5 becomes greater than the angle θ1 formed by each of the side portions of the MR element 5 with respect to the direction perpendicular to the top surface of the MR element 5. This facilitates forming the electrode-to-be film 33 on the top surface and side portions of the electrode-to-be film 31. On the top surface of the electrode-to-be film 31, in particular, the electrode-to-be film 33 can be formed without any obstacles. As a result, it is possible to form the electrode-to-be film 33 so that the ends of the electrode-to-be film 33 are precisely located in position on top of the electrode-to-be film 31 so as to be in contact with the side portions of the mask 32. Accordingly, the embodiment makes it possible to position the second layers 7b precisely, and therefore to define even a small track width of the reproducing head with high precision.

In the embodiment, portions of the hard magnetic layer 6P located on the electrode-to-be film 31 are selectively removed. This can increase the contact areas between the first layers 7a and the second layers 7b of the electrode layers 7, thereby reducing the electric resistances therebetween.

In the embodiment, the pair of first end portions 71 of the pair of first layers 7a may be inclined such that the distance between the pair of end portions 71 increases with increasing distance from the top surface of the MR element 5. In this case, it is possible to attain a smaller track width of the reproducing head.

In the embodiment, the third layers 7c greater than the second layers 7b in thickness are provided on the second layers 7b. It is therefore possible, as described above, to reduce the resistances of the electrode layers 7 while defining the track width precisely by the thin second layers 7b.

In the embodiment, it is not necessary to remove the oxide layer on the protection layer before the formation of the electrode layers 7. Therefore, the root portion of the mask 32 need not be rendered greater in height than necessary. Consequently, according to the embodiment, it is possible to avoid a problem that would arise in the case where the root portion of the mask 32 has a greater height, i.e., the problem that a short between the top shield layer and the MR element can be caused by the conductive sidewall portions.

[Second Embodiment]

Reference is now made to FIG. 13 through FIG. 20 to describe a magnetoresistive device, a thin-film magnetic head, and methods of manufacturing the same according to a second embodiment of the invention. FIG. 13 through FIG. 20 are cross sections for illustrating the method of manufacturing the magnetoresistive device of this embodiment.

Figure 13:
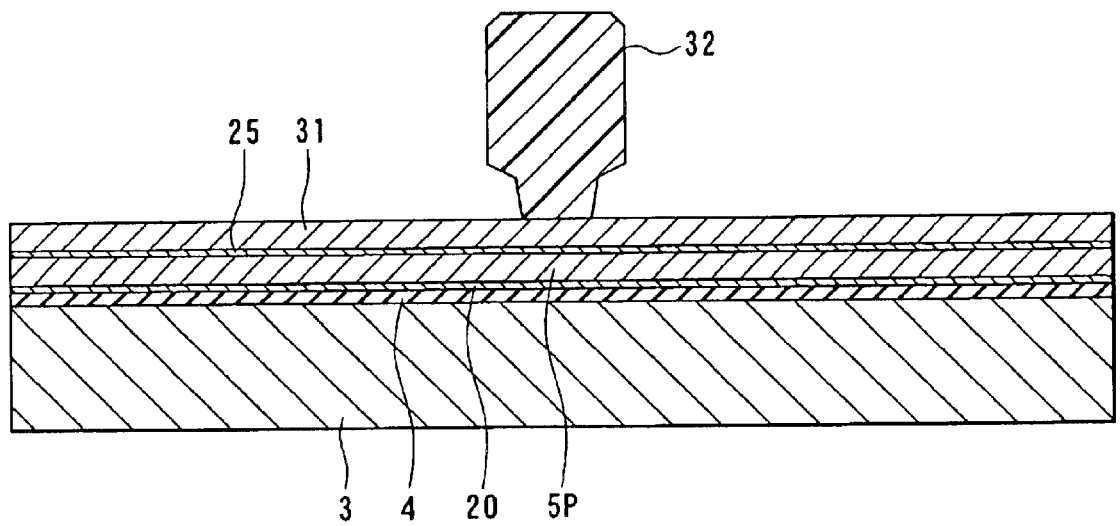
FIG. 13 is a cross section for illustrating a step of a method of manufacturing a magnetoresistive device of a second embodiment of the invention.
Figure 14:
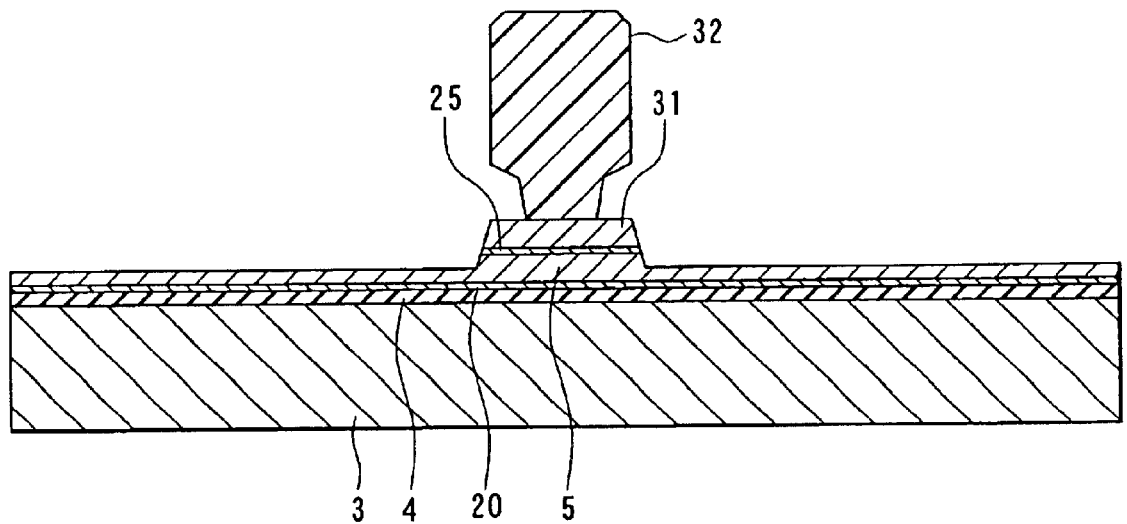
FIG. 14 is a cross section for illustrating a step that follows FIG. 13.

The method of manufacturing the magnetoresistive device of the embodiment is the same as that of the first embodiment up to the step of forming the mask 32 on the electrode-to-be film 31 as shown in FIG. 13. Then, in the embodiment, as shown in FIG. 14, ion beam etching is performed so that ion beams travel at an angle of 10°, for example, with respect to the direction perpendicular to the top surface of the bottom shield layer 3, thereby partially etching the electrode-to-be film 31, the protection layer 25, and the free layer 24 of the MR-element-to-be film 5P. In the embodiment, at this time, the layers of the MR-element-to-be film 5P below the free layer 24 are not etched. The MR-element-to-be film 5P having undergone the etching makes the MR element 5. In the MR element 5 of the embodiment, the two side portions of the free layer 24 make the two side portions of the MR element 5.

Figure 15:
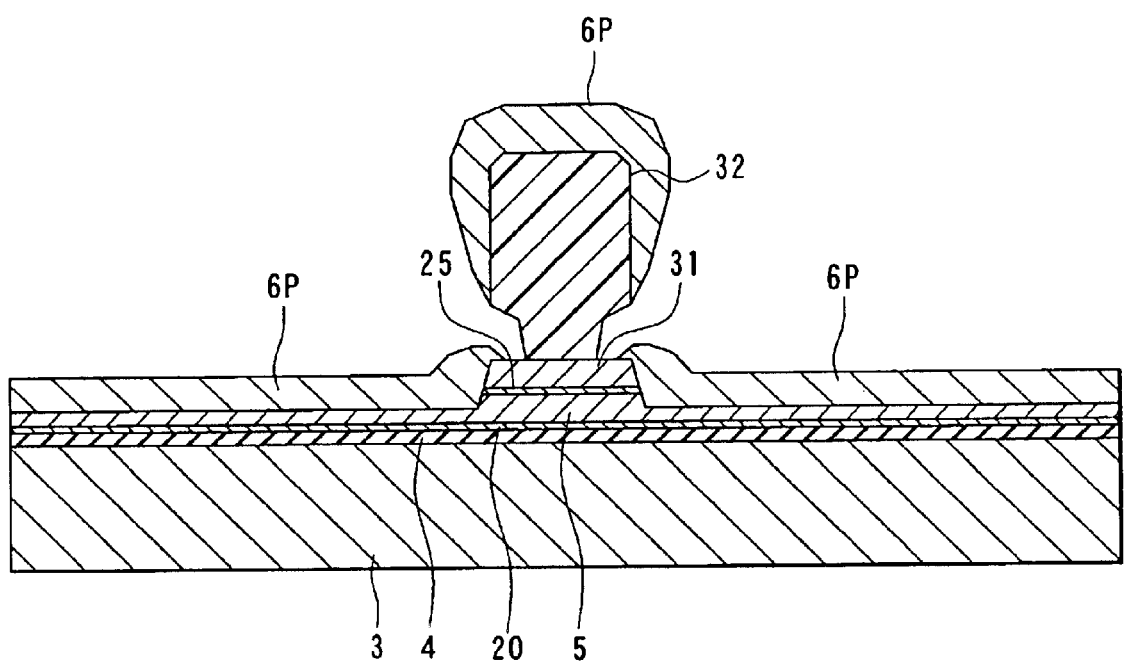
FIG. 15 is a cross section for illustrating a step that follows FIG. 14.

Next, as shown in FIG. 15, ion beam deposition is performed so that ion beams travel at an angle of 0 to 5° with respect to the direction perpendicular to the top surface of the bottom shield layer 3. The hard magnetic layer 6P to make the bias field applying layers 6 is thereby formed on the entire top surface of the laminate. The material and thickness of the hard magnetic layer 6P are the same as in the first embodiment. Instead of the hard magnetic layer 6P, for example, a laminate film made up of a Permalloy (NiFe) film and an antiferromagnetic film that are exchange-coupled may be used to make the bias field applying layers 6 to be described later.

Figure 16:
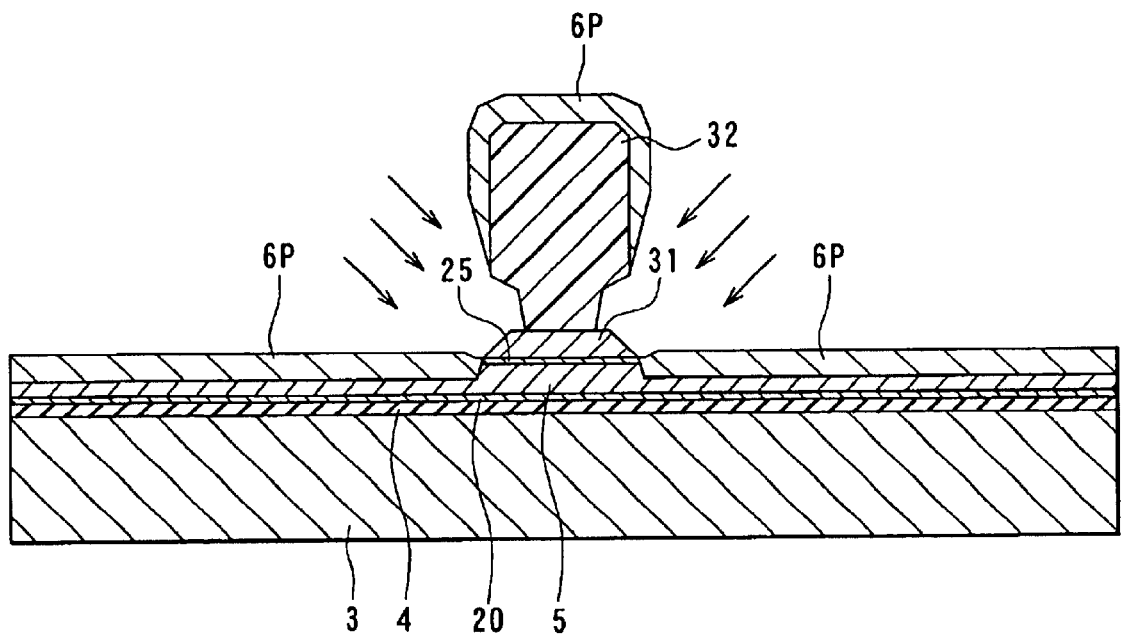
FIG. 16 is a cross section for illustrating a step that follows FIG. 15.

Next, as shown in FIG. 16, ion beam etching is performed so that ion beams travel at an angle of 30° to 75° with respect to the direction perpendicular to the top surface of the bottom shield layer 3, thereby selectively removing portions of the hard magnetic layer 6P located on the electrode-to-be film 31 and portions thereof adhering to the side portions of the electrode-to-be film 31. The arrows shown in FIG. 16 represent ion beams. This ion beam etching also etches the side portions of the electrode-to-be film 31. As a result, as in the first embodiment, the side portions of the electrode-to-be film 31 are inclined such that the distance between the side portions decreases with increasing proximity to the top of the electrode-to-be film 31. The angle formed by each of the side portions of the electrode-to-be film 31 with respect to the direction perpendicular to the top surface of the MR element 5 is greater than the angle formed by each of the side portions of the MR element 5 with respect to the direction perpendicular to the top surface of the MR element 5.

Figure 17:
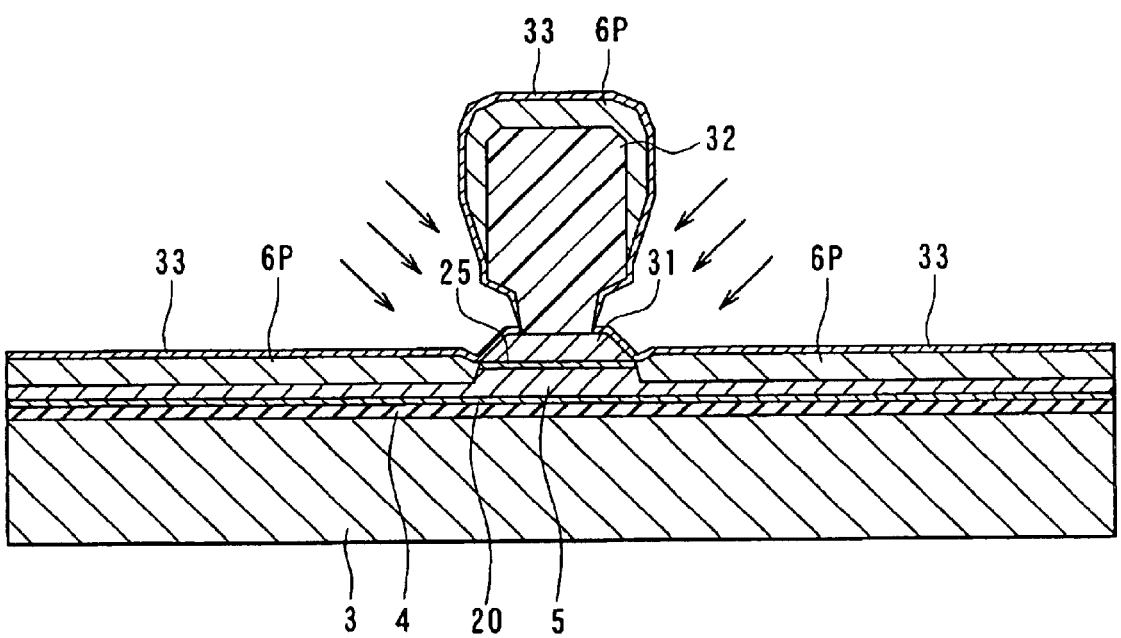
FIG. 17 is a cross section for illustrating a step that follows FIG. 16.

Next, as shown in FIG. 17, the electrode-to-be film 33 is formed on the entire top surface of the laminate with the mask 32 left unremoved. The forming method, material, and thickness of this electrode-to-be film 33 are the same as in the first embodiment. The electrode-to-be film 33 is formed to cover the top surface of the hard magnetic layer 6P, the side portions of the electrode-to-be film 31, and part of the top surface of the electrode-to-be film 31 that is not covered with the mask 32. In FIG. 17, the arrows represent ion beams.

Figure 18:
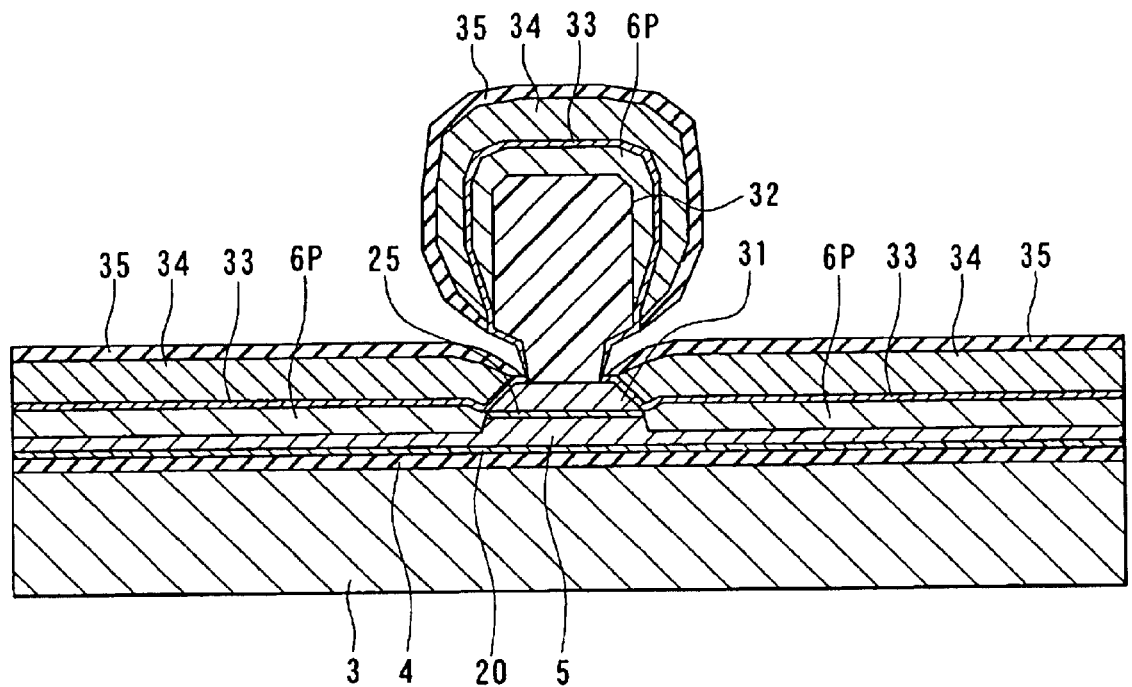
FIG. 18 is a cross section for illustrating a step that follows FIG. 17.

Next, as shown in FIG. 18, ion beam deposition is performed to form the third electrode-to-be film 34 on the entire top surface of the laminate. The electrode-to-be film 34 is made of Au, for example. The electrode-to-be film 34 has a thickness of 40 to 70 nm, for example. The electrode-to-be film 34 is located on the electrode-to-be film 33 such that the ends of the electrode-to-be film 33 located near the bottom of the mask 32 on top of electrode-to-be film 31 are exposed from the ends of the electrode-to-be film 34.

Next, a coating layer 35 is formed to cover the electrode-to-be film 34. The coating layer 35 protects the electrode-to-be film 34 at steps after the formation of the electrode-to-be film 34. The coating layer 35 may be made of a metal material with a high melting point or an insulating material. The metal material with a high melting point may be Ta, Mo, W, Ni, Cr, Ti, TiW, or TaN. The insulating material may be $Al_2O_3$, for example. The coating layer 35 has a thickness of 10 to 60 nm, for example. When a metal material with a high melting point is to be used as the material of the coating layer 35, the coating layer 35 is formed by ion beam deposition, for example. When $Al_2O_3$ is to be used as the material of the coating layer 35, the coating layer 35 is formed by chemical vapor deposition (CVD) or ion beam deposition, for example. The coating layer 35 is located on the electrode-to-be film 34 such that the ends of the electrode-to-be film 33 located near the bottom of the mask 32 on top of electrode-to-be film 31 are exposed from the ends of the coating layer 35.

Figure 19:
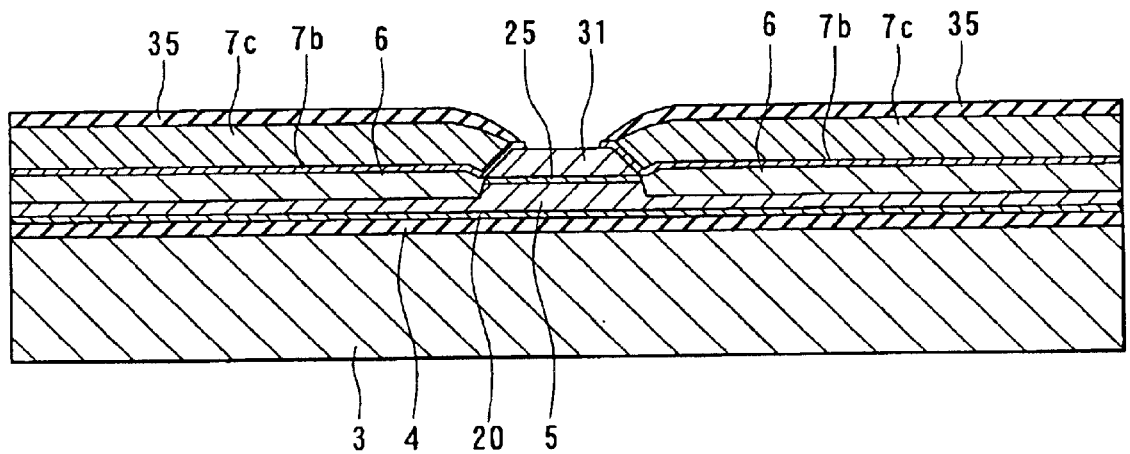
FIG. 19 is a cross section for illustrating a step that follows FIG. 18.

Next, as shown in FIG. 19, the mask 32 is lifted off. As a result, the remaining portions of the hard magnetic layer 6P make a pair of bias field applying layers 6, the remaining portions of the electrode-to-be film 33 make a pair of second layers 7b, and the remaining portions of the electrode-to-be film 34 make a pair of third layers 7c. Portions of the pair of second layers 7b located on the electrode-to-be film 31 are separated from each other with a predetermined space interposed therebetween. On the electrode-to-be film 31, the pair of end portions of the pair of second layers 7b are exposed from the pair of end portions of the pair of third layers 7c and from the ends of the coating layer 35.

Figure 20:
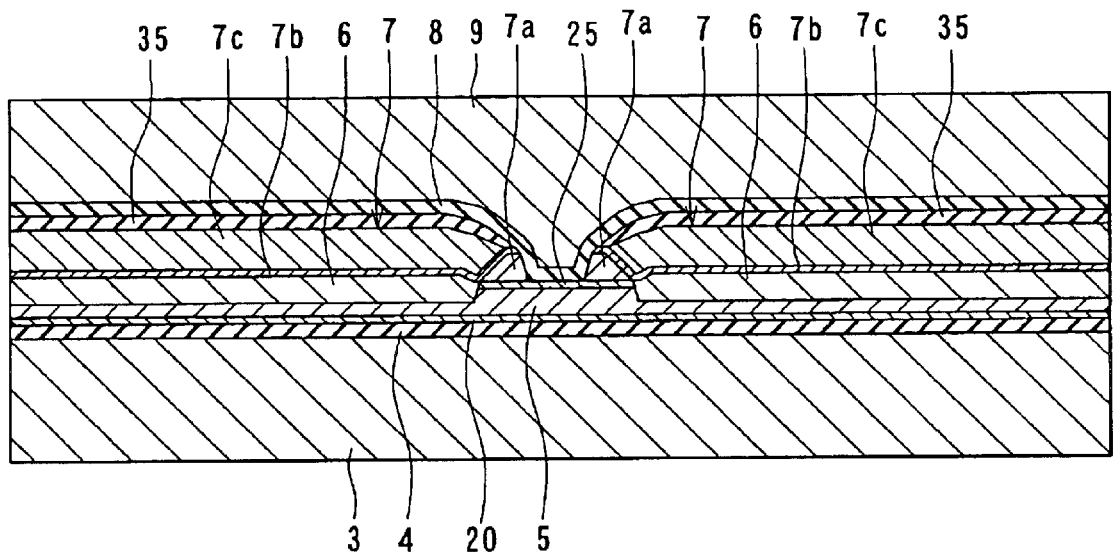
FIG. 20 is a cross section for illustrating a step that follows FIG. 19.
Figure 21:
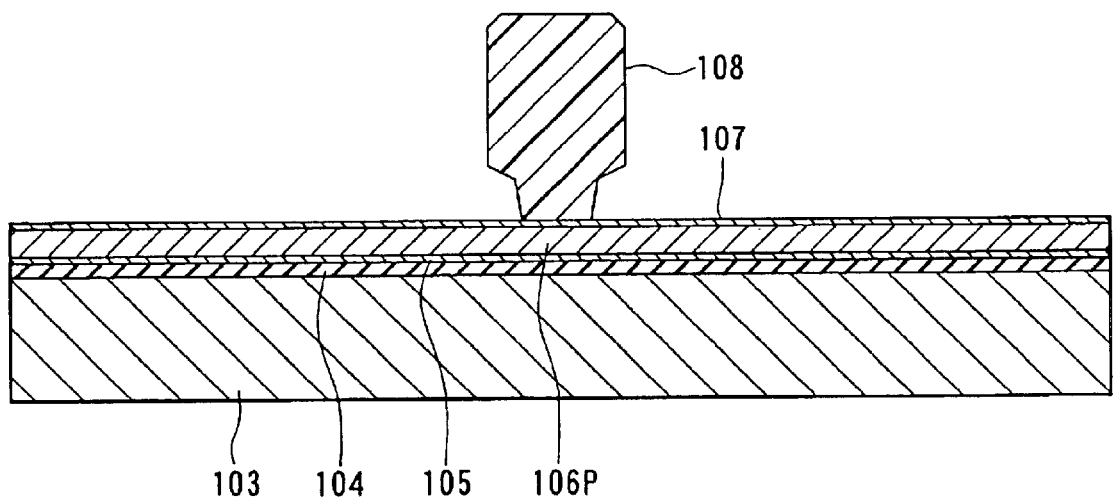
FIG. 21 is a cross section for illustrating a step of an example of a method of manufacturing a reproducing head.
Figure 22:
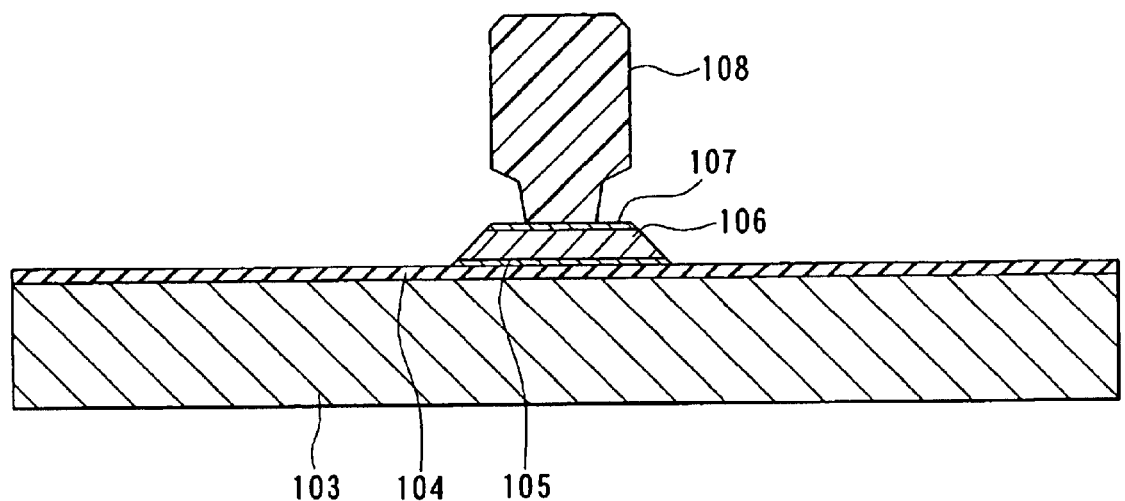
FIG. 22 is a cross section for illustrating a step that follows FIG. 21.
Figure 23:
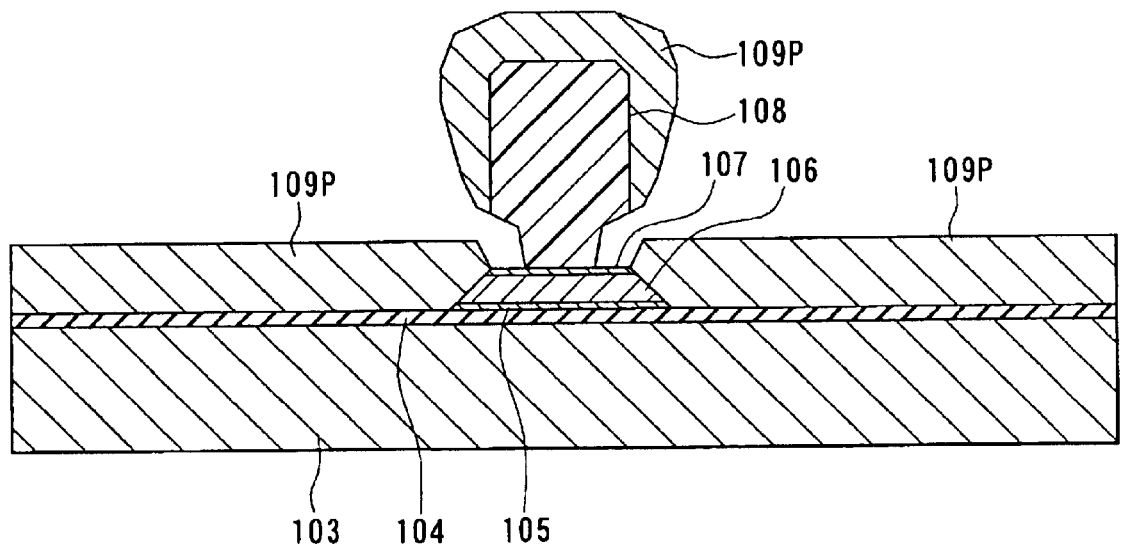
FIG. 23 is a cross section for illustrating a step that follows FIG. 22.
Figure 24:
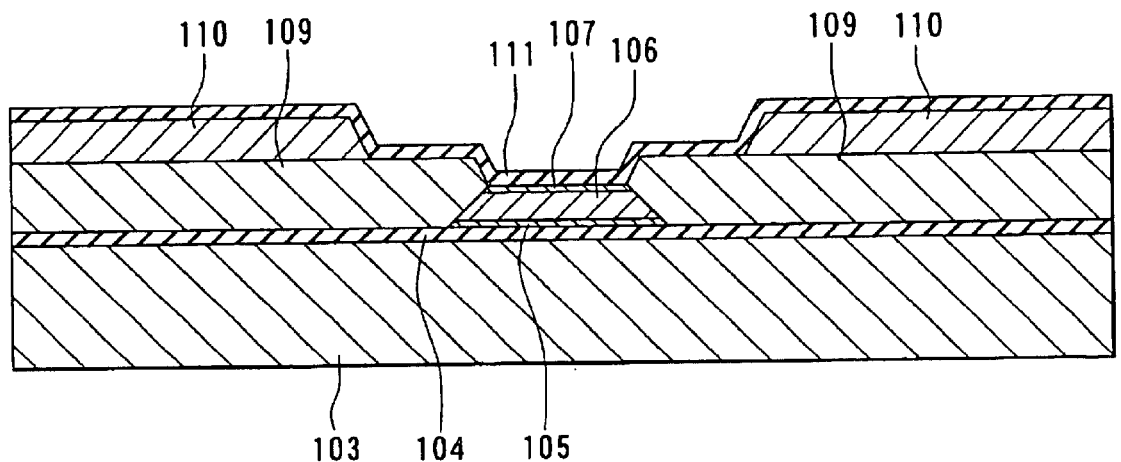
FIG. 24 is a cross section for illustrating a step that follows FIG. 23.
Figure 25:
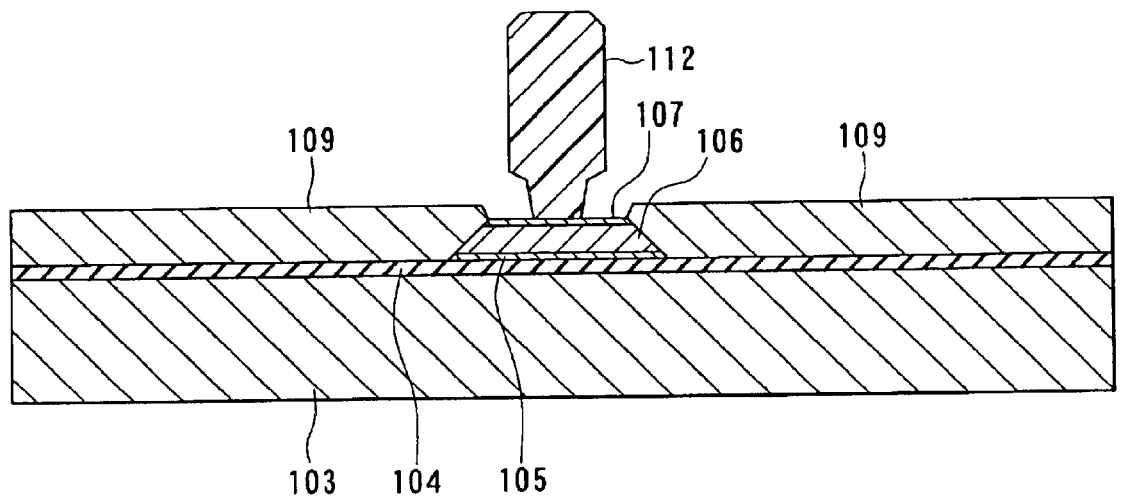
FIG. 25 is a cross section for illustrating a step of an example of a method of manufacturing a reproducing head having an overlapping electrode layer structure.
Figure 26:
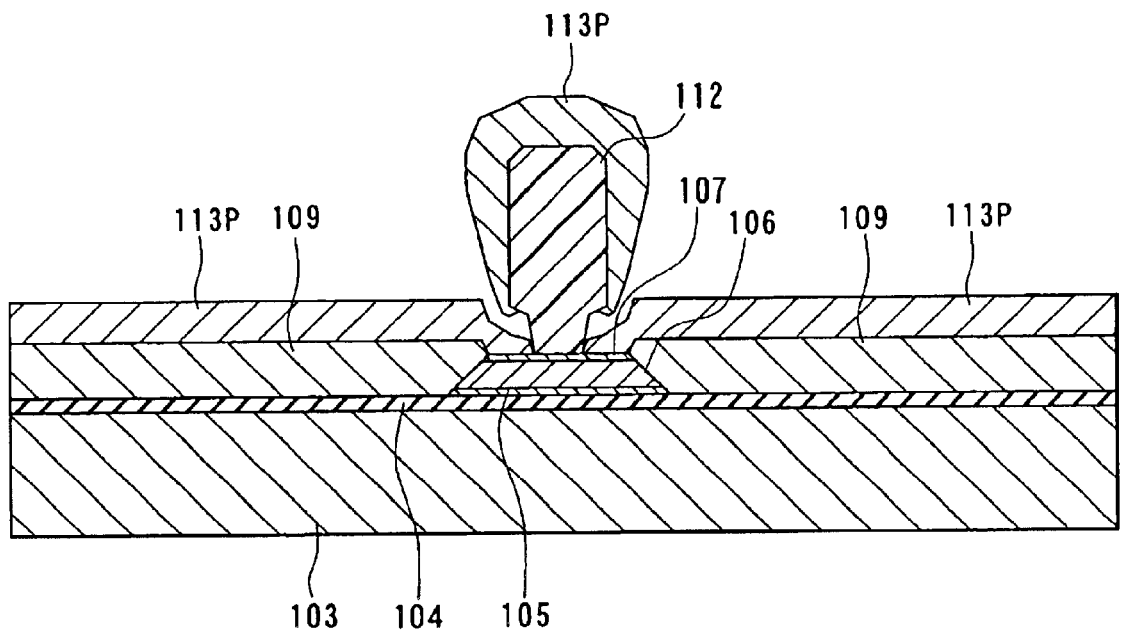
FIG. 26 is a cross section for illustrating a step that follows FIG. 25.
Figure 27:
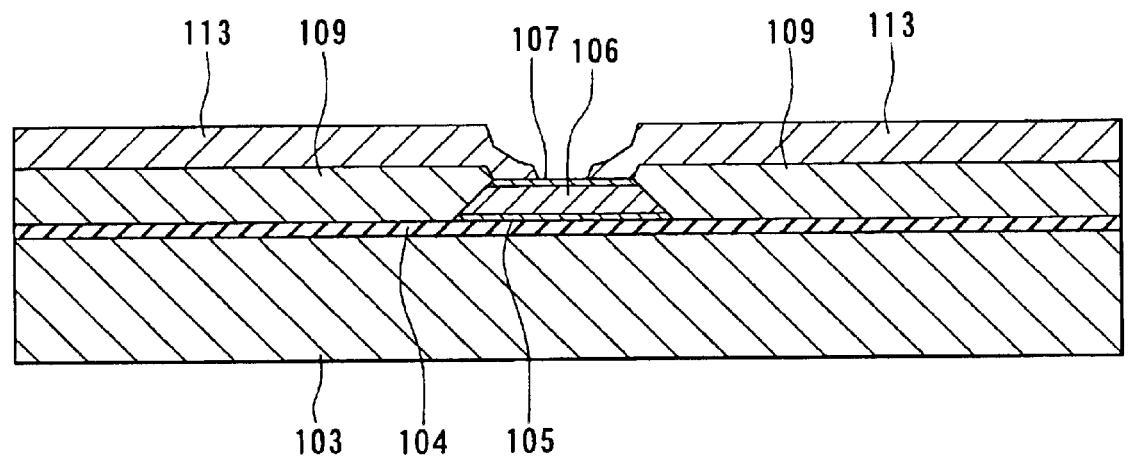
FIG. 27 is a cross section for illustrating a step that follows FIG. 26.
Figure 28:
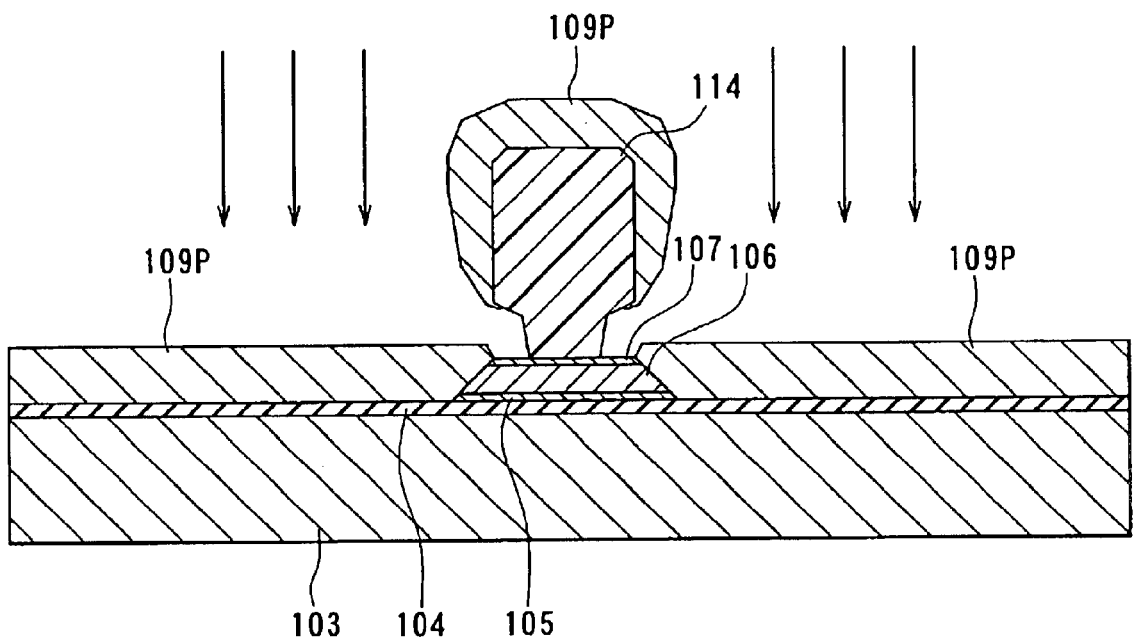
FIG. 28 is a cross section for illustrating a step of another example of the method of manufacturing the reproducing head having the overlapping electrode layer structure.
Figure 29:
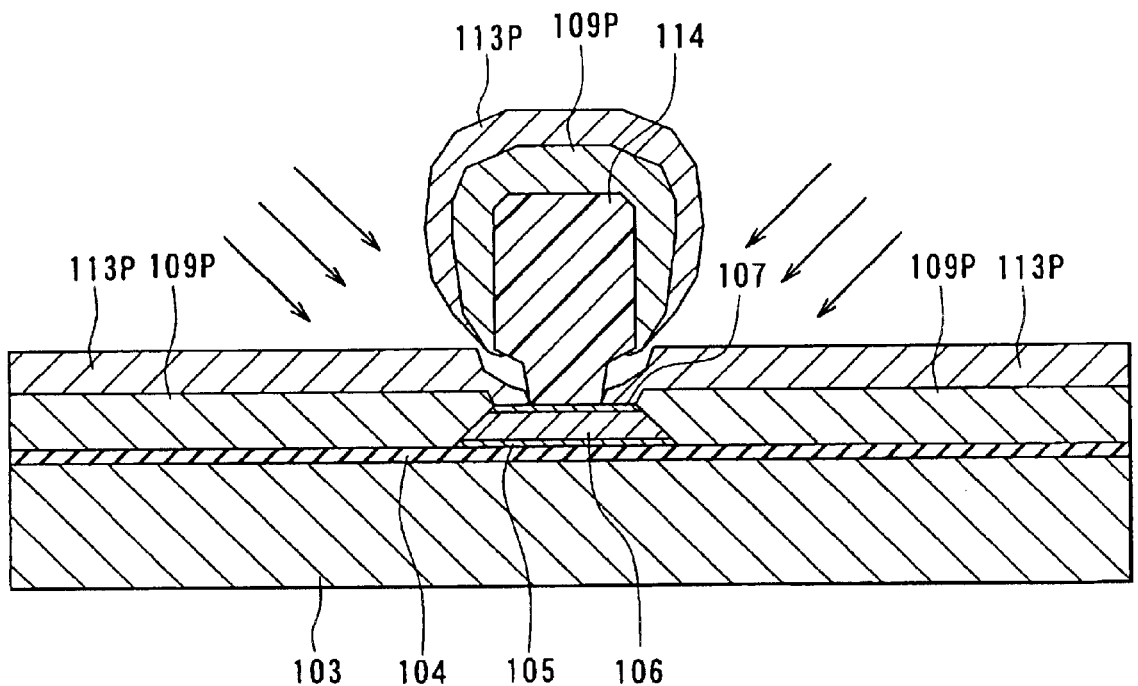
FIG. 29 is a cross section for illustrating a step that follows FIG. 28.
Figure 30:
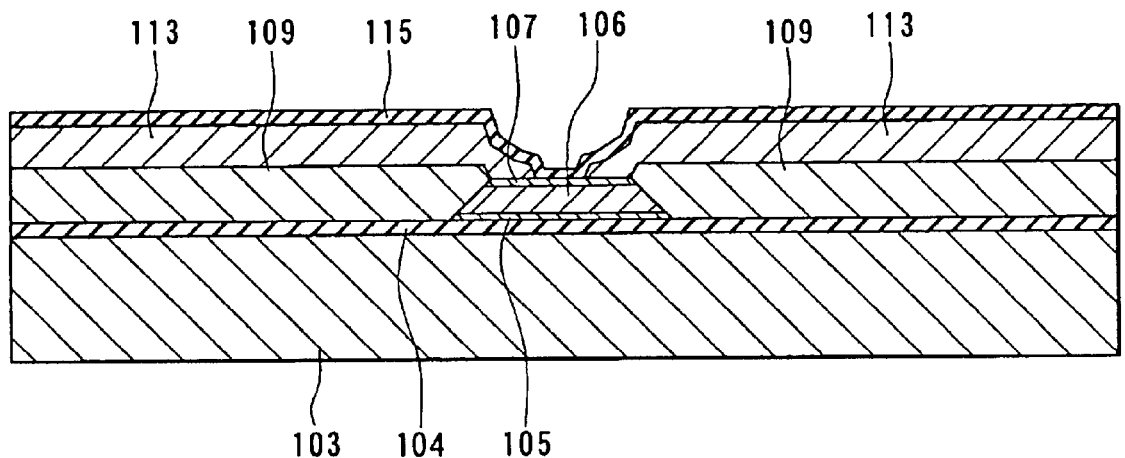
FIG. 30 is a cross section for illustrating a step that follows FIG. 29.
Figure 31:
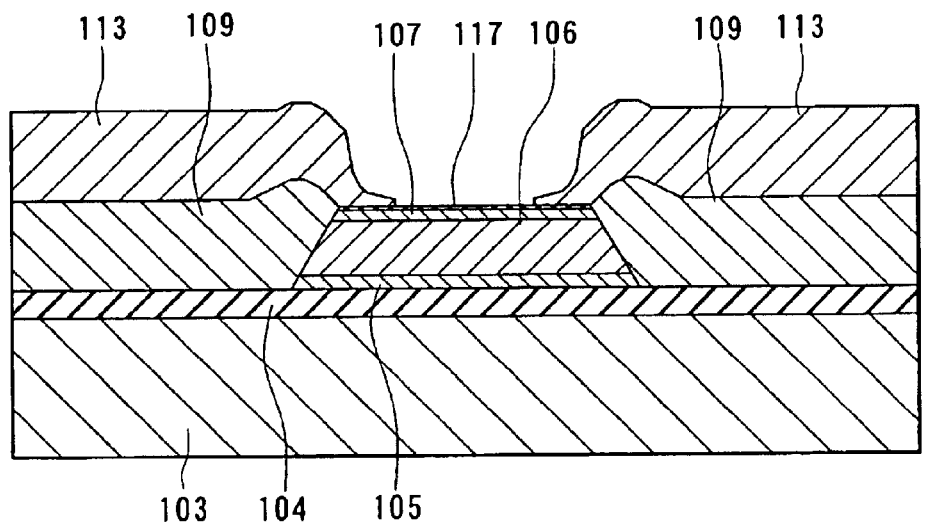
FIG. 31 is a cross section illustrating the reproducing head manufactured by the manufacturing method shown in FIG. 28 through FIG. 30 in detail.
Figure 32:
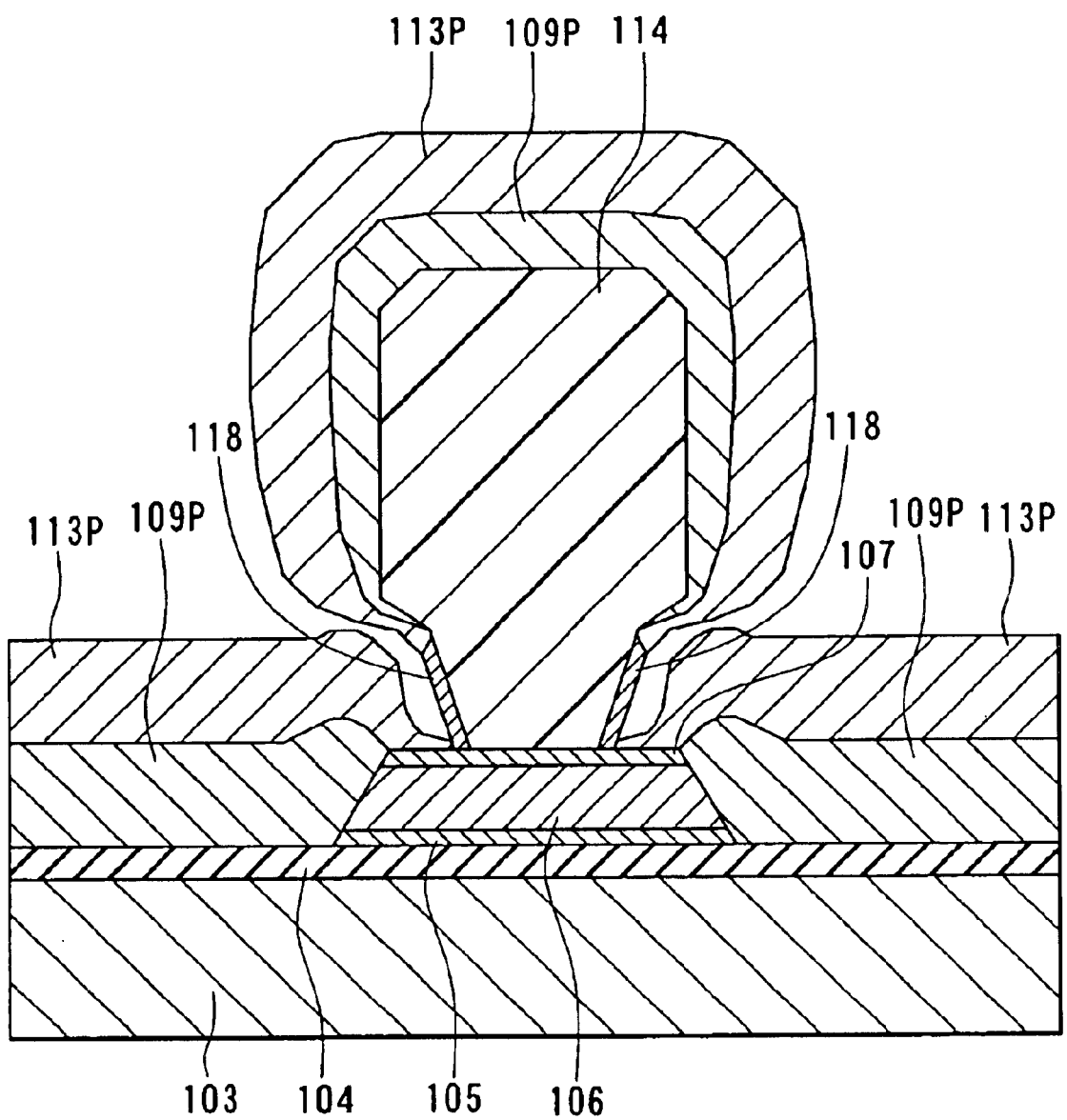
FIG. 32 is a cross section illustrating in detail a laminate obtained after the electrode-to-be film has been formed by the step shown in FIG. 29.
Figure 33:
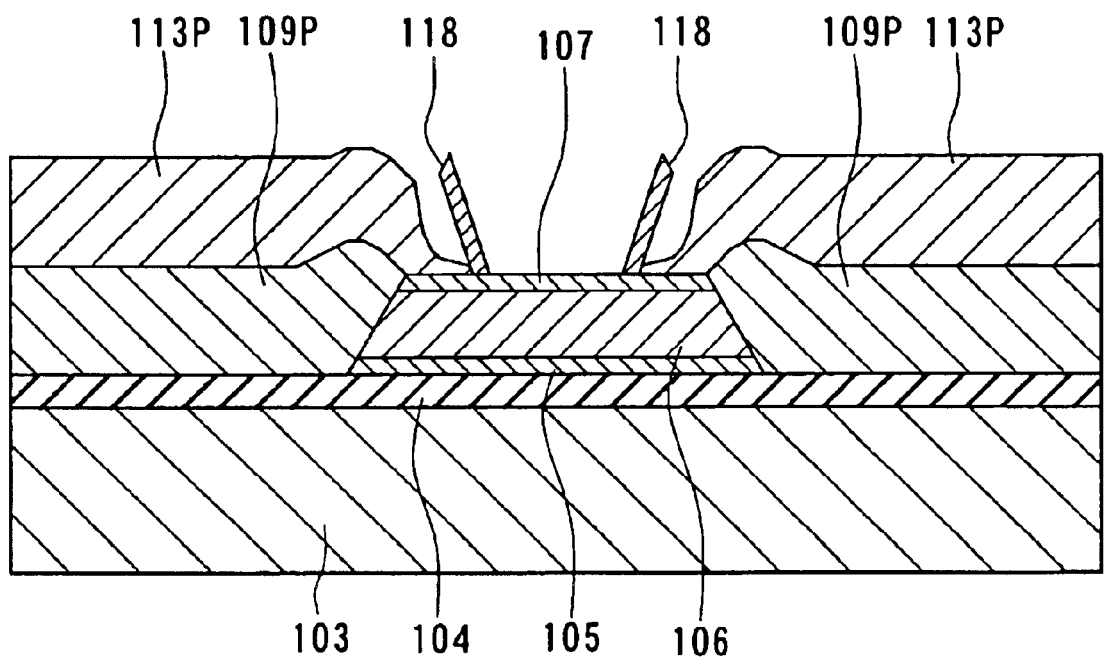
FIG. 33 is a cross section of a laminate obtained after the mask has been lifted off the laminate shown in FIG. 32.

Next, as shown in FIG. 20, the electrode-to-be film 31 is partially etched by dry etching using the second layers 7b as masks. As a result, portions of the electrode-to-be film 31 remaining under the second layers 7b make a pair of first layers 7a. The method of etching the electrode-to-be film 31 is the same as in the first embodiment.

Next, the top shield gap film 8 and the top shield layer 9 are formed in succession over the entire top surface of the laminate. Their thicknesses are the same as in the first embodiment.

As has been described, in this embodiment, the coating layer 35 is formed to cover the electrode-to-be film 34 that is to be the third layers 7c of the electrode layers 7. After that, the electrode-to-be film 31 is partially etched to make the first layers 7a. Thus, according to the embodiment, the third layers 7c are protected by the coating layer 35 during the etching of the electrode-to-be film 31. It is thereby possible to prevent the third layers 7c from loosing shape.

In the embodiment, electric insulation between the top shield layer 9 and the electrode layers 7 is improved if the coating layer 35 is an insulating layer made of an insulating material such as $Al_2O_3$. This also improves electric insulation between the MR element 5 and the top shield layer 9. In the case where the coating layer 35 is an insulating layer, the coating layer 35 corresponds to the first insulating layer of the invention, and the top shield gap film 8 corresponds to the second insulating layer of the invention.

The remainder of configuration, functions and effects of this embodiment are similar to those of the first embodiment.

The present invention is not limited to the foregoing embodiments but may be practiced in still other ways. For example, the MR element may be made up of the layers stacked in the order reverse to that of the foregoing embodiments.

In the foregoing embodiments, the thin-film magnetic head is disclosed, comprising the magnetoresistive device for reading formed on the base body and the induction-type electromagnetic transducer for writing stacked on the magnetoresistive device. Alternatively, the magnetoresistive device may be stacked on the electromagnetic transducer.

If the thin-film magnetic head is dedicated to reading, the thin-film magnetic head may comprise the magnetoresistive device for reading only.

The magnetoresistive device of the invention is applicable to not only a reproducing head of a thin-film magnetic head but also to a rotational position sensor, a magnetic sensor, a current sensor, and so on.

As has been described, in the magnetoresistive device or the thin-film magnetic head of the invention, the pair of electrode layers include: the pair of first layers each being laid over part of the one of the surfaces of the magnetoresistive element; the pair of second layers overlapping the pair of first layers and electrically connected to the first layers; and the pair of third layers laid over at least part of the pair of second layers respectively and electrically connected to the second layers, and the second layers are smaller than the third layers in thickness. As a result, according to the invention, it is possible to prevent an increase in ohmic resistance between the magnetoresistive element and the electrode layers, and to precisely locate the electrode layers at positions as designed. Therefore, the invention makes it possible to precisely define a track width for reading, even if it is small, and to improve sensitivity, output, and output stability in a magnetoresistive device or thin-film magnetic head.

In the magnetoresistive device or the thin-film magnetic head of the invention, the pair of second end portions of the pair of second layers may be located closer to the central position between the pair of second end portions than the pair of third end portions of the pair of third layers are. In this case, the pair of second end portions serve to define the track width with precision.

In the magnetoresistive device or the thin-film magnetic head of the invention, the pair of first end portions may be inclined such that the distance between the pair of first end portions increases with increasing distance from the one of the surfaces of the magnetoresistive element. In this case, it is possible to attain a smaller track width.

In the magnetoresistive device or the thin-film magnetic head of the invention, the pair of side portions of the pair of first layers may be inclined such that the distance between the pair of side portions decreases with increasing distance from the one of the surfaces of the magnetoresistive element; and each of the pair of side portions of the pair of first layers may form an angle with respect to the direction perpendicular to the one of the surfaces of the magnetoresistive element, the angle being greater than an angle formed by each of the side portions of the magnetoresistive element with respect to the direction perpendicular to the one of the surfaces of the magnetoresistive element. In this case, it is possible to position the second layers precisely, and to thereby define the track width with higher precision.

The magnetoresistive device or the thin-film magnetic head of the invention may further comprise: the first insulating layer covering the third layers; the second insulating layer covering the first layers, the second layers, and the first insulating layer; and the shield layer adjacent to the surface of the second insulating layer opposite from the first insulating layer. In this case, it is possible to improve electric insulation between the magnetoresistive element and the shield layer.

In the method of manufacturing a magnetoresistive device or the method of manufacturing a thin-film magnetic head of the invention, the pair of electrode layers include: the pair of first layers each being laid over part of the one of the surfaces of the magnetoresistive element; the pair of second layers overlapping the pair of first layers and electrically connected to the first layers; and the pair of third layers laid over at least part of the pair of second layers respectively and electrically connected to the second layers. In the invention, the first electrode-to-be film to be the first layers of the electrode layers is formed continuously after forming the protection layer on the element-to-be film that is to be the magnetoresistive element, without interposing a step of exposing the protection layer to the air. Furthermore, in the invention, the magnetoresistive element is patterned and the bias field applying layers, the second layers, and the third layers are formed by using a single mask. Furthermore, in the invention, the first layers are made by patterning the first electrode-to-be film by etching using the second layers as masks. Therefore, according to the invention, it becomes possible to prevent an increase in ohmic resistance between the magnetoresistive element and the electrode layers, and to precisely locate the electrode layers at positions as designed. Consequently, the invention makes it possible to improve sensitivity, output, and output stability of a magnetoresistive device or thin-film magnetic head.

In the method of manufacturing a magnetoresistive device or the method of manufacturing a thin-film magnetic head of the invention, the second layers may be smaller than the third layers in thickness. In this case, it is possible to precisely control the positions of the pair of second end portions of the pair of second layers. Consequently, in this case, it is possible to define the track width with higher precision.

In the method of manufacturing a magnetoresistive device or the method of manufacturing a thin-film magnetic head of the invention, the pair of second end portions of the pair of second layers may be located closer to the central position between the pair of second end portions than the pair of third end portions of the pair of third layers are. In this case, the pair of second end portions serve to define the track width precisely.

In the method of manufacturing a magnetoresistive device or the method of manufacturing a thin-film magnetic head of the invention, the pair of first end portions may be inclined such that the distance between the pair of first end portions increases with increasing distance from the one of the surfaces of the magnetoresistive element. In this case, it is possible to attain a smaller track width.

In the method of manufacturing a magnetoresistive device or the method of manufacturing a thin-film magnetic head of the invention, the side portions of the first electrode-to-be film may be inclined such that the distance between the side portions decreases with increasing distance from the one of the surfaces of the magnetoresistive element, and each of the side portions of the first electrode-to-be film may form an angle with respect to the direction perpendicular to the one of the surfaces of the magnetoresistive element, the angle being greater than an angle formed by each of the side portions of the magnetoresistive element with respect to the direction perpendicular to the one of the surfaces of the magnetoresistive element. In this case, it is possible to position the second layers precisely, and to thereby define the track width with higher precision.

The method of manufacturing a magnetoresistive device or the method of manufacturing a thin-film magnetic head of the invention may further comprise the step of selectively removing portions of the bias field applying layers located on the first electrode-to-be film, between the step of forming the bias field applying layers and the step of forming the second layers. In this case, it is possible to increase the contact areas between the first layers and the second layers, thereby reducing the electric resistances therebetween.

The method of manufacturing the magnetoresistive device or the method of manufacturing the thin-film magnetic head of the invention may further comprise the step of forming the coating layer to cover the third layers with the mask left unremoved, between the step of forming the third layers and the step of patterning the first electrode-to-be film. In this case, it is possible to protect the third layers when patterning the first electrode-to-be film.

Obviously many modifications and variations of the present invention are possible in the light of the above teachings. It is therefore to be understood that within the scope of the appended claims the invention may be practiced otherwise than as specifically described.

What is claimed is:

1. A magnetoresistive device comprising:

a magnetoresistive element having two surfaces that face toward opposite directions and two side portions;

a pair of bias field applying layers that are adjacent to the side portions of the magnetoresistive element and apply a bias magnetic field to the magnetoresistive element; and a pair of electrode layers that feed a current used for signal detection to the magnetoresistive element, each of the electrode layers being adjacent to one of surfaces of each of the bias field applying layers and overlapping one of the surfaces of the magnetoresistive element, wherein:

the pair of electrode layers include: a pair of first layers each being laid over part of the one of the surfaces of the magnetoresistive element; a pair of second layers overlapping the pair of first layers and electrically connected to the first layers; and a pair of third layers laid over at least part of the pair of second layers respectively and electrically connected to the second layers;

the pair of first layers have a pair of side portions located at positions corresponding to the side portions of the magnetoresistive element;

the pair of first layers each do not extend onto the one of the surfaces of each of the bias field applying layers;

the second layers are smaller than the third layers in thickness; and the second layers are respectively in contact with the side portions of the first layers.

2. A magnetoresistive device according to claim 1, further comprising a protection layer for protecting the magnetoresistive element, the protection layer being located between the one of the surfaces of the magnetoresistive element and the first layers.

3. A magnetoresistive device according to claim 1, wherein:

the pair of first layers have a pair of first end portions opposed to each other;

the pair of second layers have a pair of second end portions opposed to each other;

the pair of third layers have a pair of third end portions opposed to each other; and the pair second end portions are located closer to a central position between the pair of second end portions than the pair of third end portions are.

4. A magnetoresistive device according to claim 3, wherein the pair of first end portions are inclined such that the distance between the pair of first end portions increases with increasing distance from the one of the surfaces of the magnetoresistive element.

5. A magnetoresistive device according to claim 1, wherein:

the pair of side portions of the pair of first layers are inclined such that the distance between the pair of side portions decreases with increasing distance from the one of the surfaces of the magnetoresistive element; and each of the pair of side portions of the pair of first layers forms an angle with respect to the direction perpendicular to the one of the surfaces of the magnetoresistive element, the angle being greater than an angle formed by each of the side portions of the magnetoresistive element with respect to the direction perpendicular to the one of the surfaces of the magnetoresistive element.

6. A magnetoresistive device according to claim I, further comprising: a first insulating layer covering the third layers; a second insulating layer covering the first layers, the second layers, and the first insulating layer; and a shield layer adjacent to a surface of the second insulating layer opposite from the first insulating layer.

7. A method of manufacturing a magnetoresistive device comprising:

a magnetoresistive element having two surfaces that face toward opposite directions and two side portions;

a pair of bias field applying layers that are adjacent to the side portions of the magnetoresistive element and apply a bias magnetic field to the magnetoresistive element;

a pair of electrode layers that feed a current used for signal detection to the magnetoresistive element, each of the electrode layers being adjacent to one of surfaces of each of the bias field applying layers and overlapping one of the surfaces of the magnetoresistive element; and a protection layer for protecting the magnetoresistive element, the protection layer being located between the one of the surfaces of the magnetoresistive element and the electrode layers, wherein:

the pair of electrode layers include: a pair of first layers each being laid over part of the one of the surfaces of the magnetoresistive element; a pair of second layers overlapping the pair of first layers and electrically connected to the first layers; and a pair of third layers laid over at least part of the pair of second layers respectively and electrically connected to the second layers;

the pair of first layers have a pair of side portions located at positions corresponding to the side portions of the magnetoresistive element;

the pair of first layers each do not extend onto the one of the surfaces of each of the bias field applying layers; and the second layers are respectively in contact with the side portions of the first layers, the method comprising the steps of:

forming an element-to-be film that is to be the magnetoresistive element;

forming the protection layer on the element-to-be film;

forming a first electrode-to-be film that is to be the first layers of the electrode layers on the protection layer, continuously after the step of forming the protection layer, without interposing a step of exposing the protection layer to the air;

forming a mask on the first electrode-to-be film, for patterning the first electrode-to-be film, the protection layer, and the element-to-be film by etching;

patterning the first electrode-to-be film, the protection layer, and the element-to-be film by etching using the mask;

forming the bias field applying layers with the mask left unremoved;

forming the second layers of the electrode layers on the bias field applying layers with the mask left unremoved;

forming the third layers of the electrode layers on the second layers with the mask left unremoved; and patterning the first electrode-to-be film by etching using the second layers as masks, in order to make the first layers.

8. A method of manufacturing a magnetoresistive device according to claim 7, wherein the second layers are smaller than the third layers in thickness.

9. A method of manufacturing a magnetoresistive device according to claim 7, wherein:

the pair of first layers have a pair of first end portions opposed to each other;

the pair of second layers have a pair of second end portions opposed to each other;

the pair of third layers have a pair of third end portions opposed to each other; and the pair of second end portions are located closer to a central position between the pair of second end portions than the pair of third end portions are.

10. A method of manufacturing a magnetoresistive device according to claim 9, wherein the pair of first end portions are inclined such that the distance between the pair of first end portions increases with increasing distance from the one of the surfaces of the magnetoresistive element.

11. A method of manufacturing a magnetoresistive device according to claim 7, further comprising the step of etching two side portions of the first electrode-to-be film located at positions corresponding to the side portions of the magnetoresistive element, between the step of forming the bias field applying layers and the step of forming the second layers, wherein:

having gone through the step of etching, the side portions of the first electrode-to-be film are inclined such that the distance between the side portions decreases with increasing distance from the one of the surfaces of the magnetoresistive element; and each of the side portions of the first electrode-to-be film forms an angle with respect to the direction perpendicular to the one of the surfaces of the magnetoresistive element, the angle being greater than an angle formed by each of the side portions of the magnetoresistive element with respect to the direction perpendicular to the one of the surfaces of the magnetoresistive element.

12. A method of manufacturing a magnetoresistive device according to claim 7, further comprising the step of selectively removing portions of the bias field applying layers located on the first electrode-to-be film, between the step of forming the bias field applying layers and the step of forming the second layers.

13. A method of manufacturing a magnetoresistive device according to claim 7, further comprising the step of forming a coating layer to cover the third layers with the mask left unremoved, between the step of forming the third layers and the step of patterning the first electrode-to-be film.

14. A thin-film magnetic head comprising:

a medium facing surface that faces toward a recording medium;

a magnetoresistive element located near the medium facing surface and having two surfaces that face toward opposite directions and two side portions;

a pair of bias field applying layers that are adjacent to the side portions of the magnetoresistive element and apply a bias magnetic field to the magnetoresistive element; and a pair of electrode layers that feed a current used for signal detection to the magnetoresistive element, each of the electrode layers being adjacent to one of surfaces of each of the bias field applying layers and overlapping one of the surfaces of the magnetoresistive element, wherein:

the pair of electrode layers include: a pair of first layers each being laid over part of the one of the surfaces of the magnetoresistive element; a pair of second layers overlapping the pair of first layers and electrically connected to the first layers; and a pair of third layers laid over at least part of the pair of second layers respectively and electrically connected to the second layers;

the pair of first layers have a pair of side portions located at positions corresponding to the side portions of the magnetoresistive element;

the pair of first layers each do not extend onto the one of the surfaces of each of the bias field applying layers;

the second layers are smaller than the third layers in thickness; and the second layers are respectively in contact with the side portions of the first layers.

15. A thin-film magnetic head according to claim 14, further comprising a protection layer for protecting the magnetoresistive element, the protection layer being located between the one of the surfaces of the magnetoresistive element and the first layers.

16. A thin-film magnetic head according to claim 14, wherein:

the pair of first layers have a pair of first end portions opposed to each other;

the pair of second layers have a pair of second end portions opposed to each other;

the pair of third layers have a pair of third end portions opposed to each other; and the pair of second end portions are located closer to a central position between the pair of second end portions than the pair of third end portions are.

17. A thin-film magnetic head according to claim 16, wherein the pair of first end portions are inclined such that the distance between the pair of first end portions increases with increasing distance from the one of the surfaces of the magnetoresistive element.

18. A thin-film magnetic head according to claim 14, wherein:
the pair of side portions of the pair of first layers are inclined such that the distance between the pair of side portions decreases with increasing distance from the one of the surfaces of the magnetoresistive element; and
each of the pair of side portions of the pair of first layers forms an angle with respect to the direction perpendicular to the one of the surfaces of the magnetoresistive element, the angle being greater than an angle formed by each of the side portions of the magnetoresistive element with respect to the direction perpendicular to the one of the surfaces of the magnetoresistive element.

19. A thin-film magnetic head according to claim 14, further comprising: a first insulating layer covering the third layers; a second insulating layer covering the first layers, the second layers, and the first insulating layer; and a shield layer adjacent to a surface of the second insulating layer opposite from the first insulating layer.

20. A method of manufacturing a thin-film magnetic head comprising:
a medium facing surface that faces toward a recording medium;
a magnetoresistive element located near the medium facing surface and having two surfaces that face toward opposite directions and two side portions;
a pair of bias field applying layers that are adjacent to the side portions of the magnetoresistive element and apply a bias magnetic field to the magnetoresistive element;
a pair of electrode layers that feed a current used for signal detection to the magnetoresistive element, each of the electrode layers being adjacent to one of surfaces of each of the bias field applying layers and overlapping one of the surfaces of the magnetoresistive element; and
a protection layer for protecting the magnetoresistive element, the protection layer being located between the one of the surfaces of the magnetoresistive element and the electrode layers, wherein:
the pair of electrode layers include: a pair of first layers each being laid over part of the one of the surfaces of the magnetoresistive element; a pair of second layers overlapping the pair of first layers and electrically connected to the first layers; and a pair of third layers laid over at least part of the pair of second layers respectively and electrically connected to the second layers;
the pair of first layers have a pair of side portions located at positions corresponding to the side portions of the magnetoresistive element;
the pair of first layers each do not extend onto the one of the surfaces of each of the bias field applying layers; and
the second layers are respectively in contact with the side portions of the first layers, the method comprising the steps of;
forming an element-to-be film that is to be the magnetoresistive element;
forming the protection layer on the element-to-be film;
forming a first electrode-to-be film that is to be the first layers of the electrode layers on the protection layer, continuously after the step of forming the protection layer, without interposing a step of exposing the protection layer to the air;
forming a mask on the first electrode-to-be film, for patterning the first electrode-to-be film, the protection layer, and the element-to-be film by etching;
patterning the first electrode-to-be film, the protection layer, and the element-to-be film by etching using the mask;
forming the bias field applying layers with the mask left unremoved;
forming the second layers of the electrode layers on the bias field applying layers with the mask left unremoved;
forming the third layers of the electrode layers on the second layers with the mask left unremoved; and
patterning the first electrode-to-be film by etching using the second layers as masks, in order to make the first layers.

21. A method of manufacturing a thin-film magnetic head according to claim 20, wherein the second layers are smaller than the third layers in thickness.

22. A method of manufacturing a thin-film magnetic head according to claim 20, wherein:
the pair of first layers have a pair of first end portions opposed to each other;
the pair of second layers have a pair of second end portions opposed to each other;
the pair of third layers have a pair of third end portions opposed to each other; and
the pair of second end portions are located closer to a central position between the pair of second end portions than the pair of third end portions are.

23. A method of manufacturing a thin-film magnetic head according to claim 22, wherein the pair of first end portions are inclined such that the distance between the pair of first end portions increases with increasing distance from the one of the surfaces of the magnetoresistive element.

24. A method of manufacturing a thin-film magnetic head according to claim 20, further comprising the step of etching two side portions of the first electrode-to-be film located at positions corresponding to the side portions of the magnetoresistive element, between the step of forming the bias field applying layers and the step of forming the second layers, wherein:
having gone through the step of etching, the side portions of the first electrode-to-be film are inclined such that the distance between the side portions decreases with increasing distance from the one of the surfaces of the magnetoresistive element; and each of the side portions of the first electrode-to-be film forms an angle with respect to the direction perpendicular to the one of the surfaces of the magnetoresistive element, the angle being greater than an angle formed by each of the side portions of the magnetoresistive element with respect to the direction perpendicular to the one of the surfaces of the magnetoresistive element.

25. A method of manufacturing a thin-film magnetic head according to claim 20, further comprising the step of selectively removing portions of the bias field applying layers located on the first electrode-to-be film, between the step of forming the bias field applying layers and the step of forming the second layers.

26. A method of manufacturing a thin-film magnetic head according to claim 20, further comprising the step of forming a coating layer to cover the third layers with the mask left unremoved, between the step of forming the third layers and the step of patterning the first electrode-to-be film.

* * * * *